(12) United States Patent
Ide

(10) Patent No.: US 10,797,033 B2
(45) Date of Patent: Oct. 6, 2020

(54) APPARATUSES AND METHODS FOR HIGH SENSITIVITY TSV RESISTANCE MEASUREMENT CIRCUIT

(71) Applicant: Micron Technology, Inc., Boise, ID (US)

(72) Inventor: Akira Ide, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 16/121,377

(22) Filed: Sep. 4, 2018

(65) Prior Publication Data
US 2020/0075568 A1 Mar. 5, 2020

(51) Int. Cl.
| | |
|---|---|
| G11C 5/02 | (2006.01) |
| H01L 25/18 | (2006.01) |
| H01L 23/48 | (2006.01) |
| H01L 23/528 | (2006.01) |
| H03F 3/45 | (2006.01) |
| G01R 31/28 | (2006.01) |
| H03F 3/387 | (2006.01) |

(52) U.S. Cl.
CPC .......... *H01L 25/18* (2013.01); *G01R 31/2853* (2013.01); *G11C 5/02* (2013.01); *H01L 23/481* (2013.01); *H01L 23/528* (2013.01); *H03F 3/387* (2013.01); *H03F 3/4521* (2013.01); *H03F 2200/261* (2013.01)

(58) Field of Classification Search
CPC ..... H01L 25/18; H01L 23/481; H01L 23/528; G11C 5/02; H03F 3/387; H03F 3/4521
See application file for complete search history.

(56) References Cited

U.S. PATENT DOCUMENTS

| | | |
|---|---|---|
| 6,349,101 B1 | 2/2002 | Yamashita |
| 6,734,723 B2 | 5/2004 | Huijsing et al. |
| | (Continued) | |

FOREIGN PATENT DOCUMENTS

| | | |
|---|---|---|
| CN | 104414631 A | 3/2015 |
| CN | 107332394 A | 11/2017 |
| | (Continued) | |

OTHER PUBLICATIONS

U.S. Appl. No. 16/138,435, titled "Apparatuses for Selective TSV Block Testing", filed Sep. 21, 2018.

(Continued)

*Primary Examiner* — Toan K Le
(74) *Attorney, Agent, or Firm* — Dorsey & Whitney LLP

(57) ABSTRACT

Embodiments of the disclosure are drawn to apparatuses and methods for testing the resistance of through silicon vias (TSVs) which may be used, for example, to couple multiple memory dies of a semiconductor memory device. A force amplifier may selectively provide a known current along a mesh wiring structure and through the TSV to be tested. The force amplifier may be positioned on a vacant area of the memory device, while the mesh wiring structure may be positioned in an area beneath the TSVs of the layers of the device. A chopper instrumentation amplifier may be selectively coupled to the TSV to be tested to amplify a voltage across the TSV generated by the current passing through the TSV. The chopper instrumentation amplifier may be capable of determining small resistance values of the TSV.

21 Claims, 17 Drawing Sheets

(56) References Cited

U.S. PATENT DOCUMENTS

| | | | |
|---|---|---|---|
| 6,753,727 | B2 | 6/2004 | Magoon et al. |
| 6,914,480 | B2 | 7/2005 | Arai et al. |
| 8,031,001 | B2 | 10/2011 | Ide |
| 8,514,015 | B2 | 8/2013 | Chen |
| 8,994,404 | B1* | 3/2015 | Or-Bach .............. H03K 19/096 326/93 |
| 10,020,046 | B1* | 7/2018 | Uemura .............. G11C 11/4091 |
| 10,432,158 | B1* | 10/2019 | Ide .......................... H03F 3/387 |
| 2002/0190734 | A1 | 12/2002 | Burt et al. |
| 2003/0189461 | A1 | 10/2003 | Huijsing et al. |
| 2003/0231054 | A1 | 12/2003 | Magoon et al. |
| 2006/0158244 | A1 | 7/2006 | Kejariwal et al. |
| 2007/0237264 | A1 | 10/2007 | Huang et al. |
| 2008/0273106 | A1 | 11/2008 | Amini et al. |
| 2010/0013512 | A1 | 1/2010 | Hargan et al. |
| 2011/0003224 | A1 | 1/2011 | Scheibert |
| 2011/0093224 | A1 | 4/2011 | Ide et al. |
| 2012/0134193 | A1* | 5/2012 | Ide ....................... H01L 23/481 365/51 |
| 2013/0032934 | A1* | 2/2013 | Fisch ............... H01L 21/76877 257/698 |
| 2013/0135004 | A1 | 5/2013 | Hashimoto et al. |
| 2013/0153896 | A1 | 6/2013 | Whetsel |
| 2013/0249578 | A1 | 9/2013 | Yokou et al. |
| 2013/0293255 | A1 | 11/2013 | Wu et al. |
| 2014/0140138 | A1 | 5/2014 | Tran et al. |
| 2014/0241022 | A1 | 8/2014 | Nakanishi et al. |
| 2014/0312967 | A1 | 10/2014 | Nagahisa |
| 2016/0027706 | A1 | 1/2016 | Bringivijayaraghavan et al. |
| 2016/0258996 | A1 | 9/2016 | Lim et al. |
| 2017/0245035 | A1* | 8/2017 | Lee ..................... H01L 21/6836 |
| 2017/0358327 | A1 | 12/2017 | Oh et al. |
| 2018/0337209 | A1* | 11/2018 | Narui .................... H01L 27/146 |
| 2020/0020635 | A1* | 1/2020 | Chang ............... H01L 23/53214 |
| 2020/0044617 | A1 | 2/2020 | Ide |
| 2020/0096558 | A1 | 3/2020 | Ide |

FOREIGN PATENT DOCUMENTS

| | | |
|---|---|---|
| CN | 107994883 A | 5/2018 |
| KR | 20140146822 A | 12/2014 |
| TW | 201001902 A | 1/2010 |

OTHER PUBLICATIONS

International Search Report and Written Opinion for Application No. PCT/US2019/044518, dated Nov. 19, 2019.

U.S. Appl. No. 16/568,090 titled "Apparatuses and Methods for a Chopper Instrumentation Amplifier" filed Sep. 11, 2019.

Unpublished PCT Application PCT/US19/52107 titled "Apparatuses for Selective TSV Block Testing" filed Sep. 20, 2019.

International Search Report and Written Opinion for Application No. PCT/US2019/049125, dated Dec. 18, 2019.

U.S. Appl. No. 16/052,586, titled "Apparatuses and Methods for a Chopper Instrumentation Amplifier", filed Aug. 1, 2018.

* cited by examiner

US 10,797,033 B2

APPARATUSES AND METHODS FOR HIGH SENSITIVITY TSV RESISTANCE MEASUREMENT CIRCUIT

BACKGROUND

Semiconductor devices may be used for a variety of applications, such as semiconductor memory devices used to store and retrieve information in computer systems. Modern semiconductor devices may contain multiple chips (or dies) which are stacked on top of one another. In order to provide communication between the layers of the stack, it may be necessary to provide conductive elements, such as through silicon/substrate vias (TSVs), to couple the layers. Test circuitry may be provided in the semiconductor device to determine the resistance of the TSVs in order to test for, for example, manufacturing defects, damage, etc.

FIG. 1 shows a prior art memory device 100. The memory device 100 is an example of a semiconductor device which includes a plurality of layers 106a-d. The memory device 100 may be a dynamic random access memory device (DRAM). In particular, the memory device 100 may be high bandwidth memory (HBM) in which multiple memory dies are stacked on top of one another as each layer 106. The memory device 100 may store data across a plurality of memory cells (not shown) which may be contained in each layer 106. The layers 106a-d may all be physically identical to each other. The layers 106a-d may be stacked on top of one another. Although the example memory device 100 of FIG. 1 shows four layers 106a-d, it is to be understood that more or less layers 106 could be provided in other examples.

The layers 106a-d may be DRAM core dies of the memory device 100. The bottom layer 106a may be stacked on an interface die (IF die 108), which may include an amplifier 104 and an amplifier 102. The amplifier 104 may be generally referred to as a force amplifier and the amplifier 102 may be generally referred to as an instrumentation amplifier. Each of the layers 106a-d and the IF die 108 may be coupled together with through silicon/substrate vias (TSVs). In particular, each of the layers 106a-d may be coupled to an adjacent layer 106a-d (and the IF die 108) by one or more force TSVs 112, sense TSVs 114, and/or signal TSVs 110 (e.g., an upper surface of layer 106b may be coupled to layer 106c and a lower surface of layer 106b may be coupled to layer 106a). The lowest layer 106a may have a lower surface coupled to an upper surface of the IF die 108.

The layers 106a-d are stacked on top of the IF die 108. The IF die 108 includes an integrated I/O circuit (not shown) of the memory device 100. The IF die 108 may receive commands from outside the memory device 100 and provide them to the layers 106a-d along the signal TSVs 110, and may receive data from the layers 106a-d along the signal TSVs 110 and provide it outside the memory device 100. The IF die 108 may also include test circuitry, such as the instrumentation amplifier 102 and the force amplifier 104. The test circuitry may be used to measure resistance along TSVs of the memory device 100.

Each layer 106 is coupled to adjacent layers 106 (and to the IF die 108) by TSVs. The TSVs may be conductive elements which extend through the thickness of the layer 106a-d and may be coupled to a TSV running through an adjacent layer 106a-d. It may be necessary to test the TSVs to ensure they have sufficient conductance (e.g., low resistance) to couple the layers 106 to each other (and to the IF die 108). In particular, the memory device 100, as shown, includes three types of TSVs, signal TSVs 110, force TSVs 112, and sense TSVs 114. Each of the types of TSV may be physically identical to each other. The TSVs may be organized in columns, with the TSVs aligned vertically (e.g., along a normal to a surface of each of the layers 106). Each column of TSVs may be coupled together in series to form a conductive path from the IF die 108 through the layers 106a-d. Each TSV may include a conductive path which runs from a top surface of the layer 106a-d to a bottom surface of the layer 106a-d. Each TSV may include an upper portion positioned on an upper surface of the layer 106a-d and a lower portion positioned on a lower surface of the layer 106a-d. The upper portion of a given TSV may couple to a corresponding lower portion of a TSV in a next layer up, and the lower portion of the TSV may couple to a corresponding upper portion of a TSV in a next layer down in the memory device 100. Because each of the layers 106a-d may be physically identical, the top layer 106d (e.g., layer 3) may have upper portions of TSVs that are not coupled to any corresponding lower portions. Since the IF die 108 is the bottom layer of the memory device 100, the IF die 108 may only have TSV upper portions on an upper surface thereof to couple with the TSVs along the bottom surface of layer 106a, and may not have TSVs along a bottom surface of the IF die 108.

The IF die 108 includes test circuitry for measuring the resistance of the TSVs. A force amplifier 104 is coupled to the force TSVs 112. The force amplifier 104 may provide a current through the force TSVs 112. The force amplifier 104 includes a reference voltage Vref coupled to a differential amplifier. The differential amplifier provides a voltage along a line Force+ to the force TSVs 112 coupling the IF die 108 to the lowest layer 106 (e.g., layer 0). The differential amplifier also has an inverting input which is coupled to a feedback line Force−. The feedback line Force− is selectively coupled in parallel to four signal TSVs 110 coupled between the lowest layer 106a and the IF die 108. The feedback line Force− is also coupled to ground via a resistor R0.

The force TSVs 112 are arranged in a column through the memory device 100 and are coupled in series. In each layer 106, a force line Force<i>, where i is the number of the layer 106 (e.g., 0-3), is selectively coupled from between the upper and lower portions of the force TSV 112 of that layer 106a-d to the lower portion of four signal TSVs 110 in parallel along the bottom of that layer 106a-d. A transistor Force MOS may act as a switch between Force<i> and the signal TSV 110. The lower portion of each of the four signal TSVs 110 is also selectively coupled, in parallel, to a sense line Sense<i>, where i is the number of the layer 106a-d. A transistor Sense MOS may act as a switch between the signal TSV 110 and Sense<i>. The sense line Sense<i> is coupled to the column of sense TSVs 114. The sense TSVs 114 are coupled in series to a positive sense line Sense+, which is provided as an input to the instrumentation amplifier 102.

The signal TSVs 110 are coupled together in series such that each signal TSV 110 is coupled in series with the signal TSVs 110 of other layers 106a-d in a column. The IF die 108 may include an upper portion of a signal TSV (coupled to the signal TSVs 110 of the layers 106a-d) which is selectively coupled between the feedback line Force− and to a negative sense line Sense−. A similar transistor Sense MOS and transistor Force MOS act as switches to selectively couple the lower portion of the signal TSV 110 to Sense− and Force− respectively. Four columns of signal TSVs 110 are selectively coupled in parallel to the negative sense line Sense−, which is provided to a second input of the instrumentation amplifier 102. The instrumentation amplifier 102 is a differential amplifier that amplifies a difference between voltages on Sense+ and Sense−. Since Sense+ is selectively coupled to Force<n> through a lower portion of each signal TSV 110, and Sense− is selectively coupled to Force− through an upper portion of each signal TSV 110, the difference between Sense+ and Sense− may be used to determine the resistance of the signal TSV 110 as will be described in regard to FIG. 2.

In an example operation, the resistance of the signal TSV 110 from the top layer 106 (e.g., layer 3) may be determined. The transistors sense MOS and Force MOS of a particular column in top layer 106*d* may be activated to couple Force<3> and Sense<3> to the signal TSV 110. The transistors sense MOS and force MOS in the IF die 108 along the corresponding column of signal TSVs 110 may also be activated to couple that column of signal TSVs 110 to Force− and Sense−. All of the other transistors sense MOS's and Force MOS's may remain deactivated. The selective activation of the transistors may create a circuit path, the operation of which will be described in FIG. 2.

FIG. 2 shows a prior art simplified circuit path 200 of the memory device 100 of FIG. 1. The circuit path 200 illustrates the operation of the force amplifier 104 and instrumentation amplifier 102 of FIG. 1 for measuring the resistance of a selected signal TSV 210. FIG. 2 shows only the circuit path 200 through a single measured signal TSV 210 where Sense MOS and Force MOS have been activated, however it is to be understood that the actual circuit path 200 may be coupled to multiple signal TSVs 210 is parallel and multiple layers of TSVs in series along different layers of the memory device (e.g., as in memory device 100 of FIG. 1) that have deactivated Sense and Force MOSs. The circuit path 200 may be selectively moved between different signal TSV 210 by activation of switches, such as the Sense MOS and Force MOS of FIG. 1.

The force amplifier 204 provides a voltage Vfa to establish a reference current Iref. The reference current Iref passes through the force TSV 212 and through the signal TSV 210. The force amplifier 204 may use feedback to keep Iref constant. The reference current Iref generates a voltage Vx across the signal TSV 210. The instrumentation amplifier 202 amplifies the differential voltage Vx across one or more of the signal TSVs 210 in a column. The voltage Vx may be coupled to the instrumentation amplifier 202 via sense TSV(s) 214. Since the current Iref is known and the voltage Vx is measured, the resistance may be determined.

As an example operation, if a constant current Iref of 200 µA is used, and the amplification of the instrumentation amplifier 202 is 25 fold, then the output voltage from the instrumentation amplifier 202 is proportional to the signal TSV 210 resistance at a scale of 200 Ω/V. If the output from instrumentation amplifier 202 is used to judge a pass (low enough resistance of the signal TSV 210) or failure of the circuit with a cutoff point of 0.5V, then the circuit path 200 is sensitive to resistances of 100Ω or more.

The circuit path 200 may include a resistor Rfl_core to model the wire resistance between the force TSV 212 and the upper portion of the signal TSV 210 and a resistor Rfl_if to model the wire resistance between the lower portion of the signal TSV 210 and the force amplifier 204. With these resistances, along with the reference voltage Vref input to the force amplifier 204 the input voltages to the instrumentation amplifier 202 may be calculated by equations 1 and 2 below:

$$Vin(-) \approx Vref + Rfl\_if \cdot Iref \qquad \text{Eqn. 1}$$

$$Vin(+) \approx Vref + Rfl\_if \cdot Iref \qquad \text{Eqn. 2}$$

$$Vfa \approx Vref + Rflif * Iref + Vx + Rflcore * Iref \approx$$
$$Vref + 2 * Rfl * Iref \leq Vdd \qquad \text{Eqn. 3}$$

Equation 3 assumes that the Rfl_core is nearly equal to Rfl_if and that Rfl_core=Rfl_if =Rfl. Vdd is the power supply voltage provided to the amplifiers. In order to maintain a linear relationship between the input and the output of the amplifiers 202, 204 without distorting the amplified waveform, the outputs must be kept below the power supply voltages Vdd. From the above it may be seen that Rfl has an upper limit Rflmax, which may be calculated by equation 4, below:

$$Rflmax \approx \frac{(Vdd - Vref)}{2 * Iref} \qquad \text{Eqn. 4}$$

Similarly, assuming that the signal TSV 210 to be measured is close to the force TSV 212, then the lower limit of Rfl, Rflmin, may be calculated by equation 5 below and may be shown to be roughly 0.

$$Rfl\ min \approx 0 \qquad \text{Eqn. 5}$$

As well as a signal difference between the input voltages Vin(+) and Vin(−) of the instrumentation amplifier 202, there may be a common mode potential Vcom. Assuming that Vx is small enough, Vcom may be calculated by equation 6 below:

$$Vcom \approx Vref + Rfl \cdot Iref \qquad \text{Eqn. 6}$$

By substituting equations 4 and 5 into equation 6, a maximum common voltage Vcom_max and minimum common voltage Vcom_min may be calculated by equations 7 and 8, respectively, below:

$$Vcom\_max \approx (Vdd + Vref)/2 \qquad \text{Eqn. 7}$$

$$Vcom\_min \approx Vref \qquad \text{Eqn. 8}$$

The common voltage Vcom needs to lie in a range (e.g., between Vcom_min and Vcom_max) such that the instrumentation amplifier 202 provides a linear output over a full range of the power supply voltages (e.g., 0V to Vdd) provided to the instrumentation amplifier 202.

The instrumentation amplifier 202 (which may be the same as the instrumentation amplifier 102 of FIG. 1) has two stages, each of which has a gain, A1 and A2, respectively. The gain of these stages may be determined by the values of the resistors R1-R4 which are coupled between the component differential amplifiers of the instrumentation amplifier 202. In particular, the gains A1 and A2 may be calculated by equations 9 and 10, respectively, below:

$$A1 = 1 + 2(R2/R1) \qquad \text{Eqn. 9}$$

$$A2 = R4/R3 \qquad \text{Eqn. 10}$$

If we assume that the differential input voltage Vx produced by flowing current Iref through the signal TSV 210 is split evenly between the two input terminals, then the voltage of the two input terminals may be calculated by equations 11 and 12, below:

$$Vin(+) = Vcom + Vx/2 \qquad \text{Eqn. 11}$$

$$Vin(-) = Vcom - Vx/2 \qquad \text{Eqn. 12}$$

From equations 11 and 12, the highest and lowest voltages Va and Vb within the instrumentation amplifier 202 can be calculated by equations 13 and 14, below:

$$Va = Vcom + Vx/2 + Vx(R2/R1) \qquad \text{Eqn. 13}$$

$$Vb = Vcom - Vx/2 - Vx(R2/R1) \qquad \text{Eqn. 14}$$

From these equations, in order to maintain the linearity of the output voltage of the instrumentation amplifier 202, three conditions must be met. As expressed by equation 15, below, the gain of the second stage on the difference between the highest and lowest internal voltages Va and Vb must not be greater than the power supply voltage Vdd. From equation 15, the maximum and minimum common voltages Vcom_max and Vcom_min may be determined with equations 16 and 17, respectively, below:

$$A2(Va-Vb) \leq Vdd \qquad \text{Eqn. 15}$$

$$Vcom_{max} \leq Vdd - Vdd/(2*A2) \qquad \text{Eqn. 16}$$

$$Vcom_{min} \leq Vdd/(2*A2) \qquad \text{Eqn. 17}$$

FIG. 3 shows a prior art TSV block 400 of the IF die. The IF die 300 is shown as both a block diagram representation 316 and a layout image representation 317. The IF die 300 may include a TSV block 318 and a TSV test block 319 which may include the test circuitry (e.g., the instrumentation amplifier 102 and 202 and the force amplifier 104 and 204 of FIGS. 1 and 2). The TSV test block 319 may be located underneath the TSV block 318. Multiple TSV test blocks 319 may be arranged underneath the TSV block 318. The TSV test blocks 319 may repeat at intervals based on how many individual TSVs each TSV test block 319 is capable of testing.

It may be necessary to locate the TSV test block 319 directly underneath the TSV blocks 318 in order to reduce resistance of the current force wiring by reducing the length of the current force wiring (e.g., minimize Rfl_core and Rfl_if). As determined in Equations 4 and 5, there are maximum (and minimum) limits to the allowable current force resistance to maintain linearity of the output. As may be seen from FIG. 3, the TSV test blocks 319 may be bulky components which may increase the area of the TSV block 300 of the IF die (and in turn, the memory device 100 of FIG. 1). It may be desirable to provide a high sensitivity test circuit to determine the resistance of the TSVs which may also occupy less area compared to conventional TSV test blocks.

DETAILED DESCRIPTION

The following description of certain embodiments is merely exemplary in nature and is in no way intended to limit the disclosure or applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Layers of a semiconductor device, such as a memory device, may be coupled together by conductive elements, such as through silicon vias (TSVs). The TSVs may need to be tested in order to ensure adequate coupling (e.g., a low enough resistance) between the layers. Test circuitry may be provided in an interface die that the layers of the semiconductor device are stacked on. Since the test circuitry (e.g., the instrumentation amplifier) may be a bulky component, it may be desirable to move the test circuits to vacant areas of the memory chip. Further, it may be desirable to provide a high gain amplifier such that even small changes in resistance of the TSV can be measured.

Figure 1:
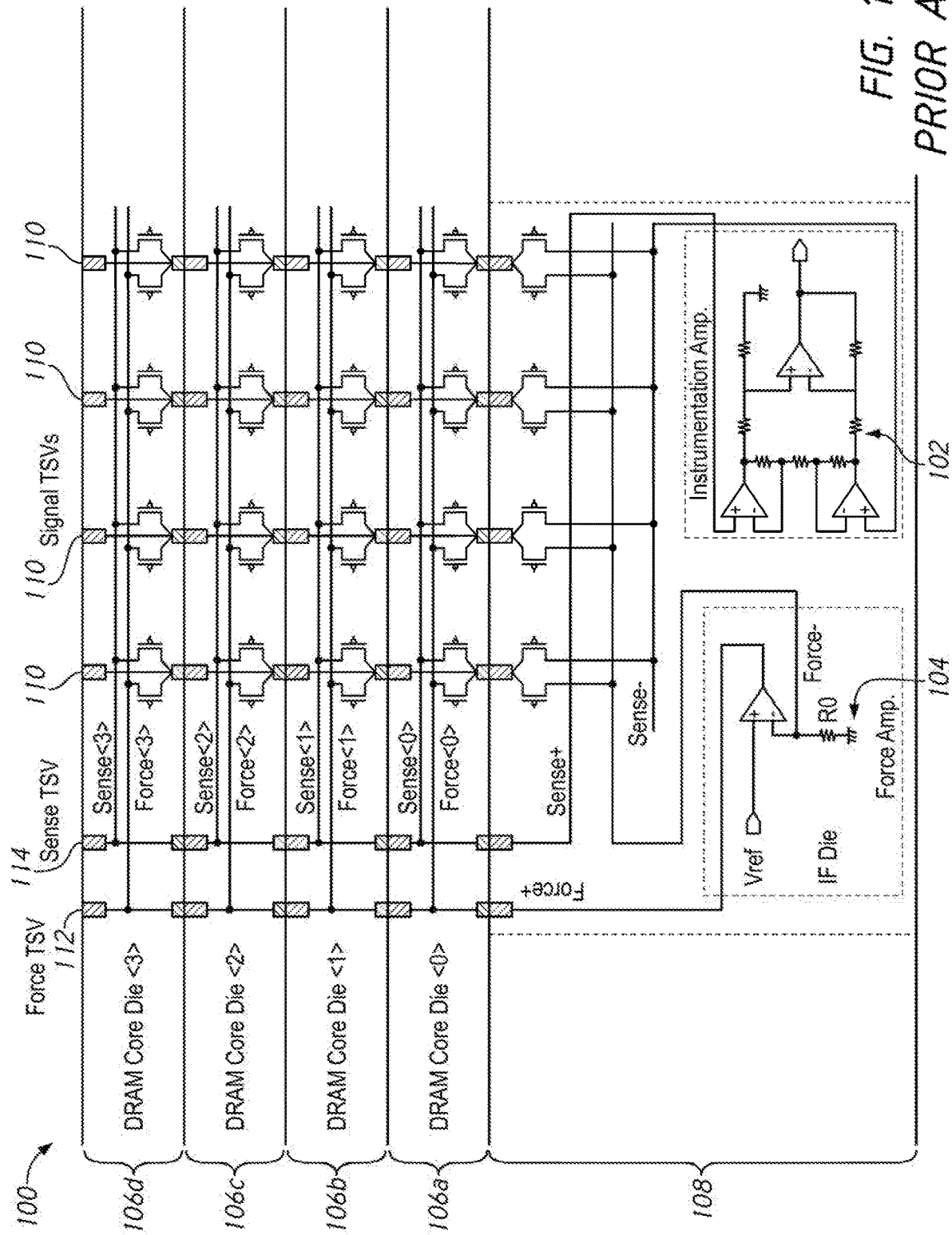
FIG. 1 is a schematic diagram of a prior art memory device.
Figure 2:
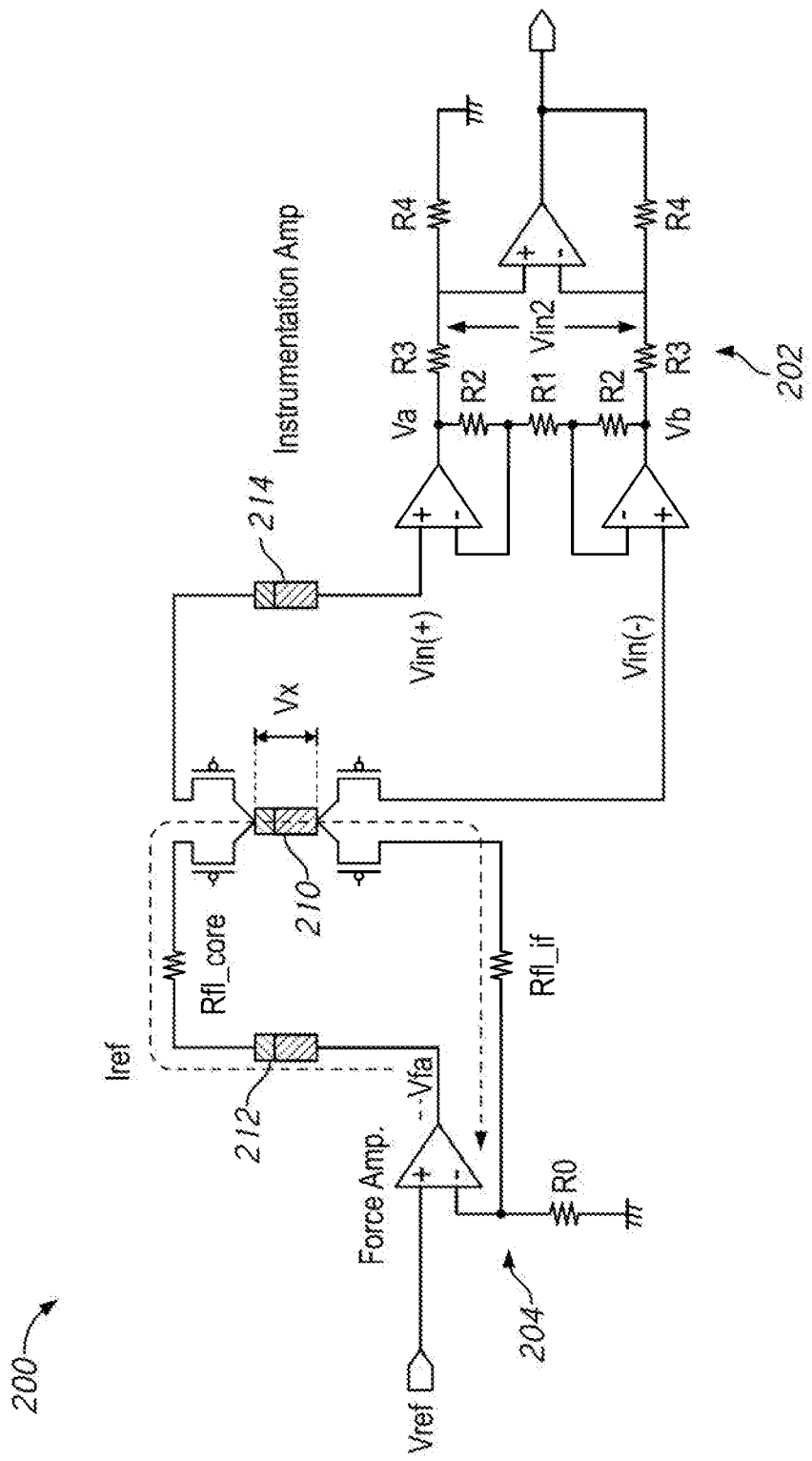
FIG. 2 is a schematic diagram of a prior art circuit path.
Figure 3:
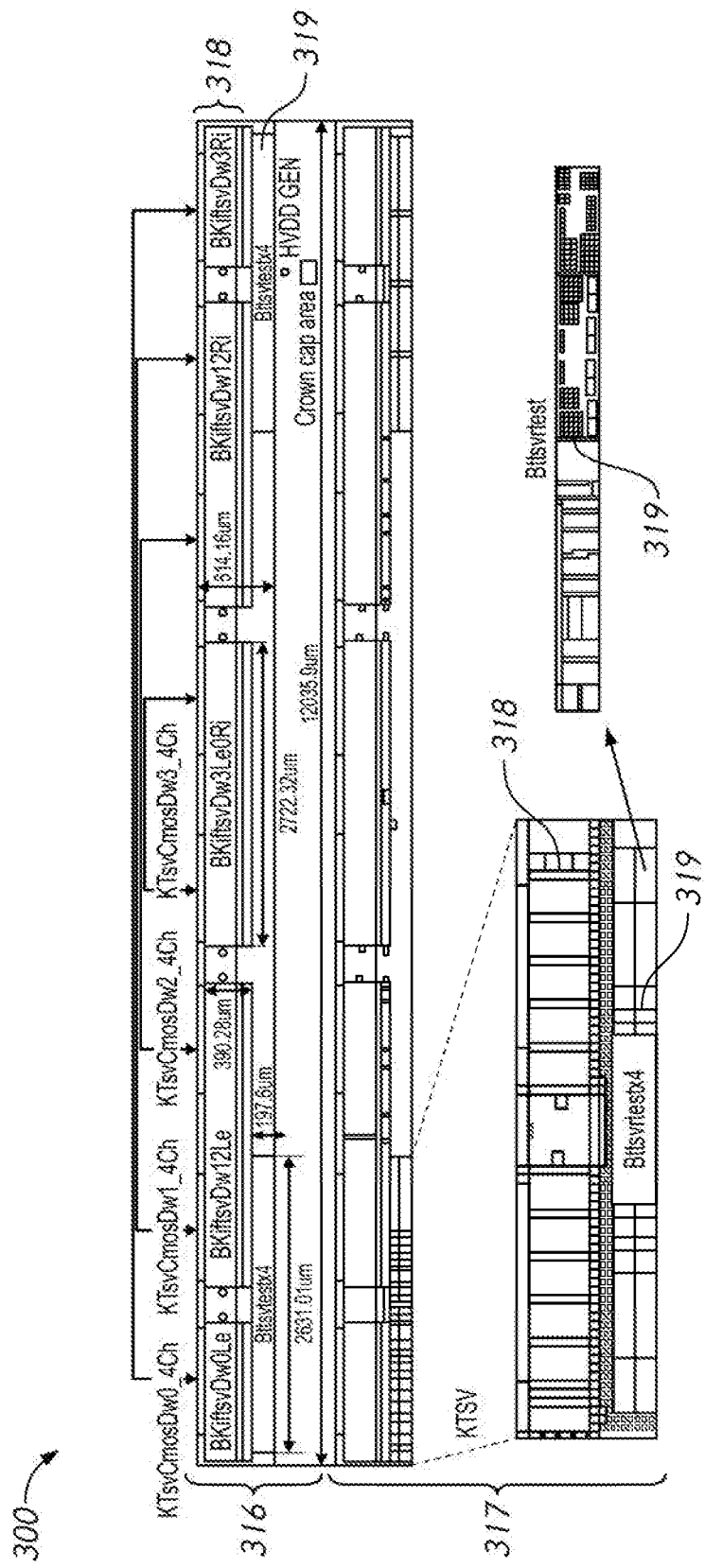
FIG. 3 is a block diagram of a prior art TSV block of an IF die.
Figure 4:
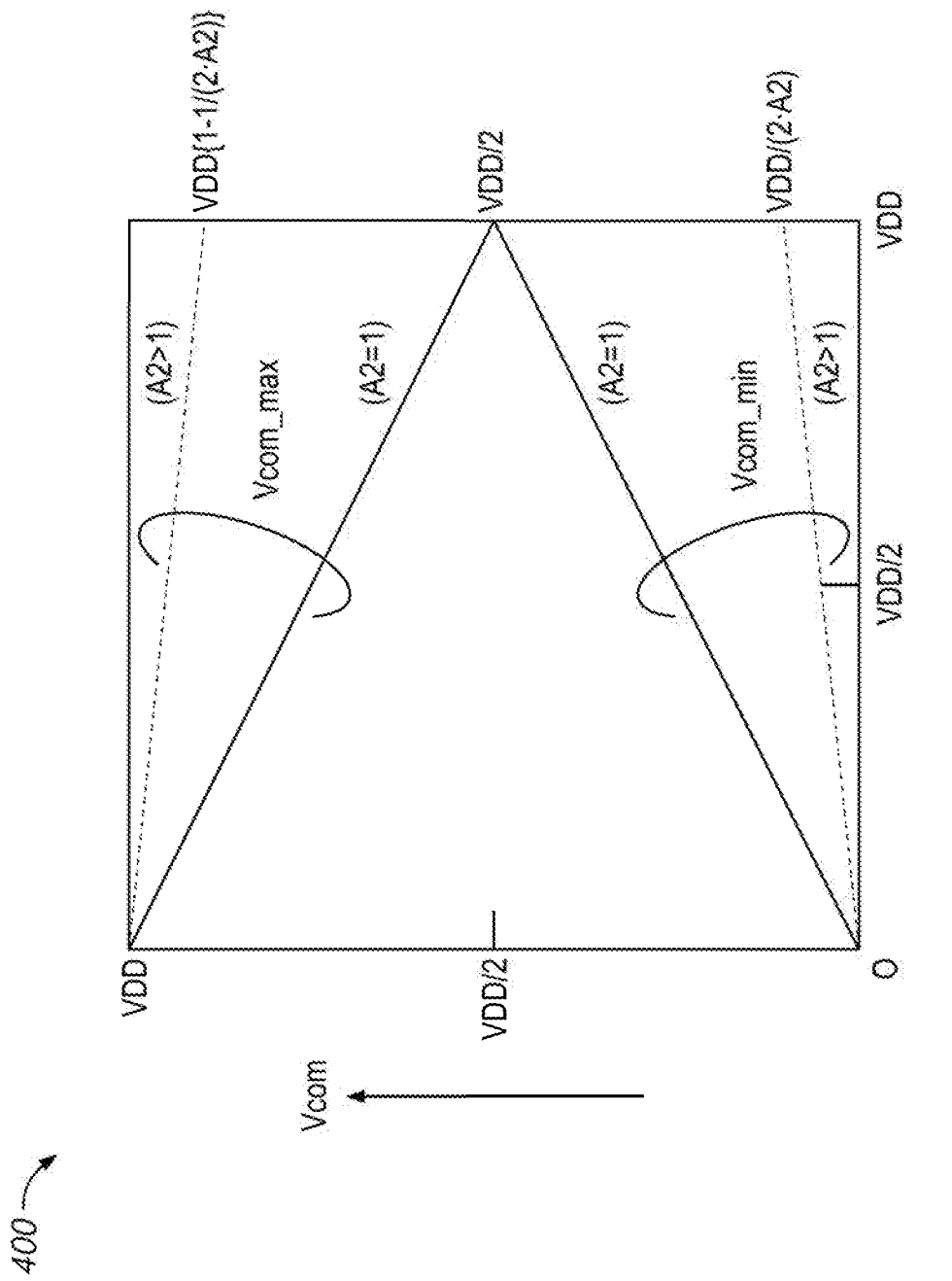
FIG. 4 is an operating characteristics diagram for the prior art instrumentation amplifier of FIG. 1.

FIG. 4 is an operating characteristics diagram 400 for the instrumentation amplifier 102 of FIG. 1 and 202 of FIG. 2. The diagram 400 shows the output VOUT of the instrumentation amplifier along the x-axis and the common voltage Vcom at the two inputs (e.g., the common voltage between Vin(+) and Vin(−) of FIG. 1) along the y-axis. Both axes extend from 0V to the power supply voltage VDD.

The diagram 400 shows lines to represent the allowable Vcom_max and Vcom_min to maintain linearity (e.g., following equations 16 and 17 above) for two different conditions of the second gain A2. The solid line represents a situation in which A2=1. The dashed lines represent a situation in which A2>1. From the diagram 400, it can be seen that when the output voltage is increased to VDD, the only allowable common voltage Vcom is VDD/2 when the gain of the second stage is 1. However, if the gain is increased, then even when the output voltage Vout is VDD, the allowable Vcom values are between VDD{1−1/(2*A2)} and VDD/(2*A2). Accordingly, an amplifier may be provided which allows for a high gain as well as a broad range of allowable Vcom values.

Figure 5:
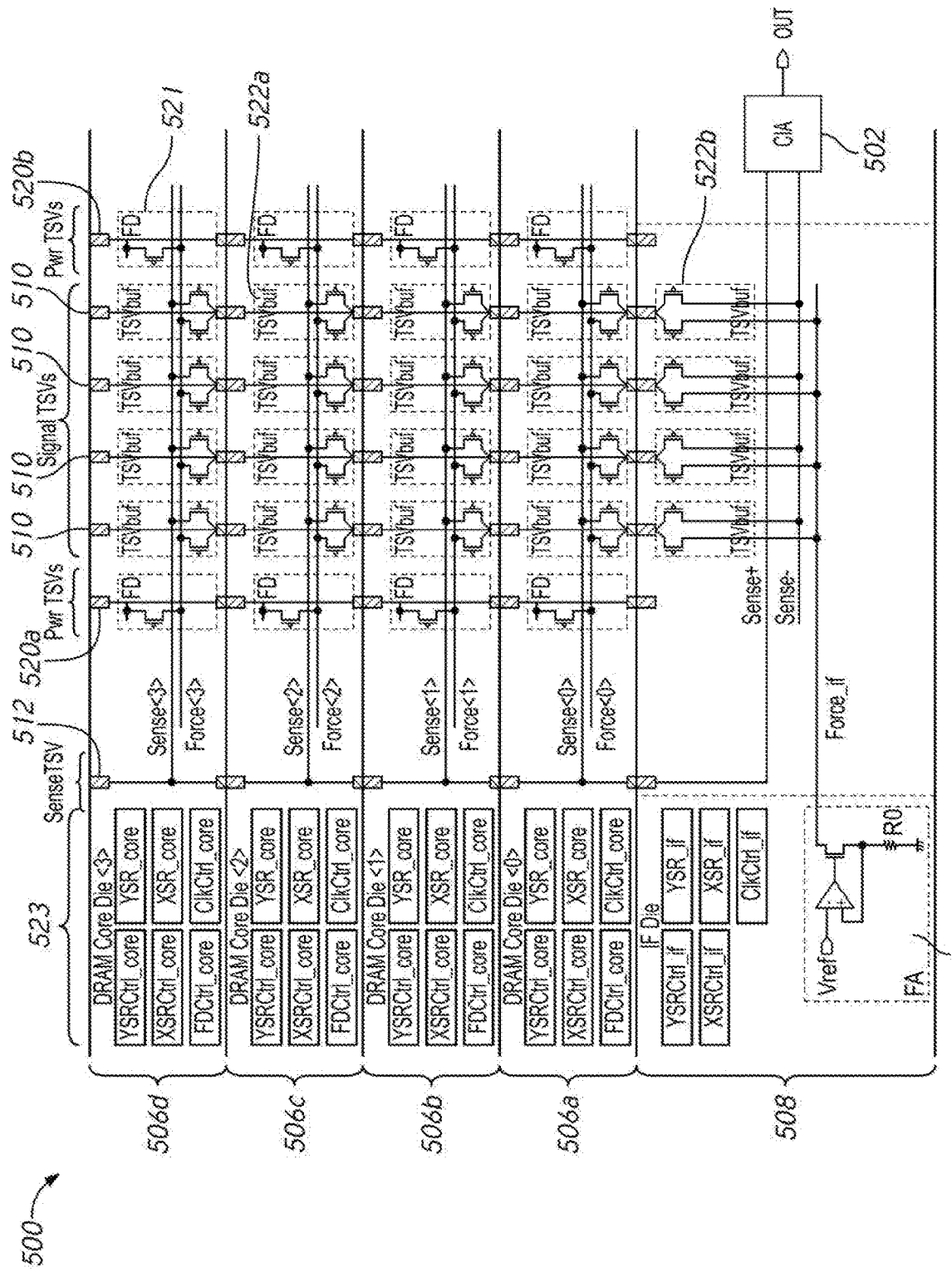
FIG. 5 is a schematic diagram of a memory device according to an embodiment of the present disclosure.

FIG. 5 shows a memory device 500 according to an embodiment of the present disclosure. The memory device 500 may include layers 506a-d which are stacked on top of an IF die 508. The IF die 508 includes an amplifier 502 and an amplifier 504. In some embodiments of the disclosure, the amplifier 502 is a chopper instrumentation amplifier, and amplifier 502 will be referred to as such, and the amplifier 504 may be referred to as a force amplifier. The layers 506a-d are coupled to each other and to the IF die 508 with TSVs which may include sense TSVs 512, power TSVs 520a-b, and signal TSVs 510. The signal TSVs 510 may be coupled to TSV buffer circuits 522. Each of the power TSVs 520a-b is coupled to a current supply circuit 521. Each layer 506a-d and the IF die 508 may include shift registers 523, which may be used to control the TSV buffer circuits 522 and/or the current supply circuits 522.

While reference will be made to the memory device 500 with regard to certain descriptions of orientation (e.g., upper and lower portions, top and bottom surfaces, etc.) it is to be understood that these are intended for descriptive purposes only, and only imply relative placement of components in the memory device 500. The memory device 500 may assume any spatial orientation.

The memory device 500 may be a dynamic random access memory device (DRAM), in which memory dies are stacked together in layers 506a-d. Each of the layers 506a-d may be a die of the memory, such as a memory core die. In some embodiments of the disclosure, the DRAM device is a high bandwidth memory (HBM). Each of the layers 506a-d may include internal circuitry (not shown) such as memory cells. The IF die 508 may contain interface components, such as an I/O circuit of the memory device 500. The signal TSVs 510 may selectively couple the internal circuitry of the layers 506a-d to the interface components of the IF die 508. Although a particular configuration of memory device 500 is shown in FIG. 5, it is to be understood that various arrangements may be made. For example, more or less layers may be provided in a different arrangement of the memory device 500. Similarly, although a memory device 500 is described, it is to be understood that the TSVs and TSV resistance testing methods and apparatuses of the present disclosure may be used with any number of integrated circuit devices involving stacked elements.

Similar to the TSVs described in regards to FIG. 1, the TSVs 510, 512, and 520a-b may each be composed of an upper portion and a lower portion. The upper portion may be positioned along an upper surface of each of the layers 506a-d, while the lower portion may be positioned along an lower surface of each of the layers 506a-d and the IF die 508. The upper and lower portions may be coupled together by a conductive path running through the layer 506a-d. The upper and lower portions of a given TSV may be contacts along the upper and lower surfaces, respectively, of the layers 506a-d. The TSVs may be arranged in columns such that when the layers 506a-d are stacked on each other and the IF die 508, the upper and lower portions of each TSV are coupled to lower and upper portions respectively of corresponding TSVs in adjacent layers to form a conductive path between the layers 506a-d and the IF die 508. Each layer is coupled via the TSVs to the adjacent layers (e.g., layer 506c is coupled to layer 506d and to layer 506b). The bottom layer 506a is coupled to the IF die 508. Each of the layers 506a-d may be physically identical to one another. Thus, the top layer (e.g., layer 506d) may include lower portions of TSVs that are not coupled to any corresponding upper portions.

The IF die 508 may contain test circuitry for determining the resistance of the signal TSVs 510. The test circuitry may include a force amplifier 504 and a chopper instrumentation amplifier 502. The force amplifier 504 may provide a current Iref along a line Force_if to the TSV buffer circuits 522b of the IF die 508. The force amplifier 504 may include a differential amplifier (e.g., an operational amplifier), which includes two inputs and an output. The first input is coupled to a reference voltage Vref. The force amplifier may provide an output to the gate of a transistor. This transistor may be of an N-channel type. The source of the transistor may be coupled to ground through a feedback resistor R0. The second input of the differential amplifier may be coupled between the source of the transistor and R0. A drain of the transistor may be coupled to the line Force_if. In some embodiments, the line Force_if may be a mesh wiring structure, as described in FIG. 10.

The TSV buffer circuits 522b may be coupled to the upper portions of the signal TSVs 510 positioned along the lower surface of the IF die 508. One (or more) buffer circuits of the TSV buffer circuits 522b may be selectively activated to couple the line Force_If to one (or more) columns of signal TSVs 510. The TSV buffer circuits 522b may also be coupled to a negative input Sense− of the chopper instrumentation amplifier (CIA) 502.

The power TSVs 520a-b may be a pair of columns of TSVs positioned on either side of a group of columns of signal TSVs 510. As shown in the example layout of FIG. 5, the power TSVs 520a-b are positioned on either side of a group of four columns of signal TSVs 510. More or less signal TSVs may be grouped between the power TSVs in other examples. The power TSVs 520a-b may selectively provide the power supply voltage Vdd along a line Force<i> in each layer 506a-d where i is the number of the layer (e.g., 0-3). Force<i> may be selectively coupled to the power TSVs 520a-b via current supply circuit (FD) 521.

The lower portion of each of the signal TSVs 510 may be coupled to a TSV buffer circuit 522a, which may selectively couple the lower portion of the signal TSV 510 to Force<n>. The TSV buffer circuits 522a may also selectively couple the lower portion of the signal TSVs 510 to a line Sense<i> where i is the number of the layer 506a-d. Each of the layers 506a-d sense lines Sense<i> is coupled to the sense TSVs 512. The sense TSVs 512 provide a positive signal Sense+ to the IF die 508.

The CIA 502 amplifies a difference between the voltage on Sense+ and the voltage on Sense−. When the current supply circuit 521 and the TSV buffer circuit 522a-b are active, the reference current Iref may flow from the layer 506a-d with the activated current supply circuit 521 through the column of signal TSVs 510 coupled to the activated TSV buffer circuits 522a-b. A voltage difference may be generated across the signal TSV 510 that current is flowing through, which may be coupled to Sense+ and Sense−, and amplified by the CIA 502. The CIA 502 may provide an output voltage OUT based on the difference between Sense+ and Sense−. The components and operation of the CIA 502 are described in more detail in regard to FIGS. 7-9.

Each of the layers 506a-d and the IF die 508 may include shift registers 523. The shift registers 523 may be used to control the selective coupling of the signal and power TSVs 510, 520a-b by controlling the switches of the TSV buffer circuits 522a-b and the current supply circuits 521. The IF die 508 may have the same shift registers 523 as the layers 506a-d, or may have more or less shift registers 523. For example, as shown the IF die 508 does not have the shift register FDCtrl_core since there are no current supply circuits 521 in the IF die 508.

The TSVs (e.g., signal TSVs 510, sense TSVs 512, and power TSVs 520a-b) may be arranged together in a TSV block. The TSV block may be an area of the layers 506a-d (and IF die 508) where one or more of the TSVs are located. Corresponding TSVs may be arranged in columns such that, for example, the signal TSV 510 in layer 506d is vertically aligned with corresponding signal TSVs in layers 506a-c and IF die 508. Accordingly, the TSV block may be a volume within the memory device 500 formed by the TSV blocks in each of the layers 506a-d when they are stacked on top of one another. The IF die 508 may have an area corresponding to the TSV block(s) of the layers 506a-d, as indicated by the dotted lines in the IF die 508. The area in the IF die 508 may be bounded by a perimeter of the vertically aligned TSVs of the stacked layers. The CIA 502 and the force amplifier 504 may be located outside the area of the IF die 508 which is underneath the TSV block(s) of the stacked layers 506a-d (e.g., outside the dotted lines of the IF die 508 of FIG. 5). In some embodiments, the CIA 502 and/or force amplifier 504 may be located in regions of the IF die 508 which do not contain other components of the IF die 508 and may generally be referred to as vacant regions of the IF die 508.

In an example TSV resistance measurement operation, the FDCtrl_core shift register 523 may activate the current supply circuit 521 of the layer 506a-d that the selected TSV 510 is in. The FDCtrl_core shift register 523 may provide a signal to a transistor of the current supply circuit 521 to couple the Force<i> line to a power supply voltage Vdd. The XSR_core and YSR_core shift registers 523 of the layer 506a-d containing the selected TSV 510 and the IF die 508 may activate the TSV buffer circuits 522a,b along the column containing the selected TSV 510. XSR_core and YSR_core may provide signals X and Y respectively to the TSV buffer circuits 522a,b. The signals X and Y may activate transistors Force MOS and Sense MOS of the TSV buffer circuit 522a,b, which may couple the signal TSV 510 to the force amplifier 504 and the CIA 502. The force amplifier 504 may provide a constant current Iref based on the reference voltage Vref and feedback resistor R0 (Iref=Vref/R0) coupled to the force amplifier 504. The current Iref may flow along the vertical column of signal TSVs 510 between the layer 506a-d containing the selected signal TSV 510 and the IF die 508. The current Iref may generate a voltage drop Vx across the selected TSV 510 based on the resistance of the TSV 510. The CIA 502 may amplify a voltage difference (e.g., Vx) across the selected TSV(s) 510 (e.g., the voltage difference between Sense+ and Sense−). Since the current Iref is known, the resistance of the selected TSV 510 may be determined based on the measured voltage Vx (e.g., by Ohm's law).

Figure 6:
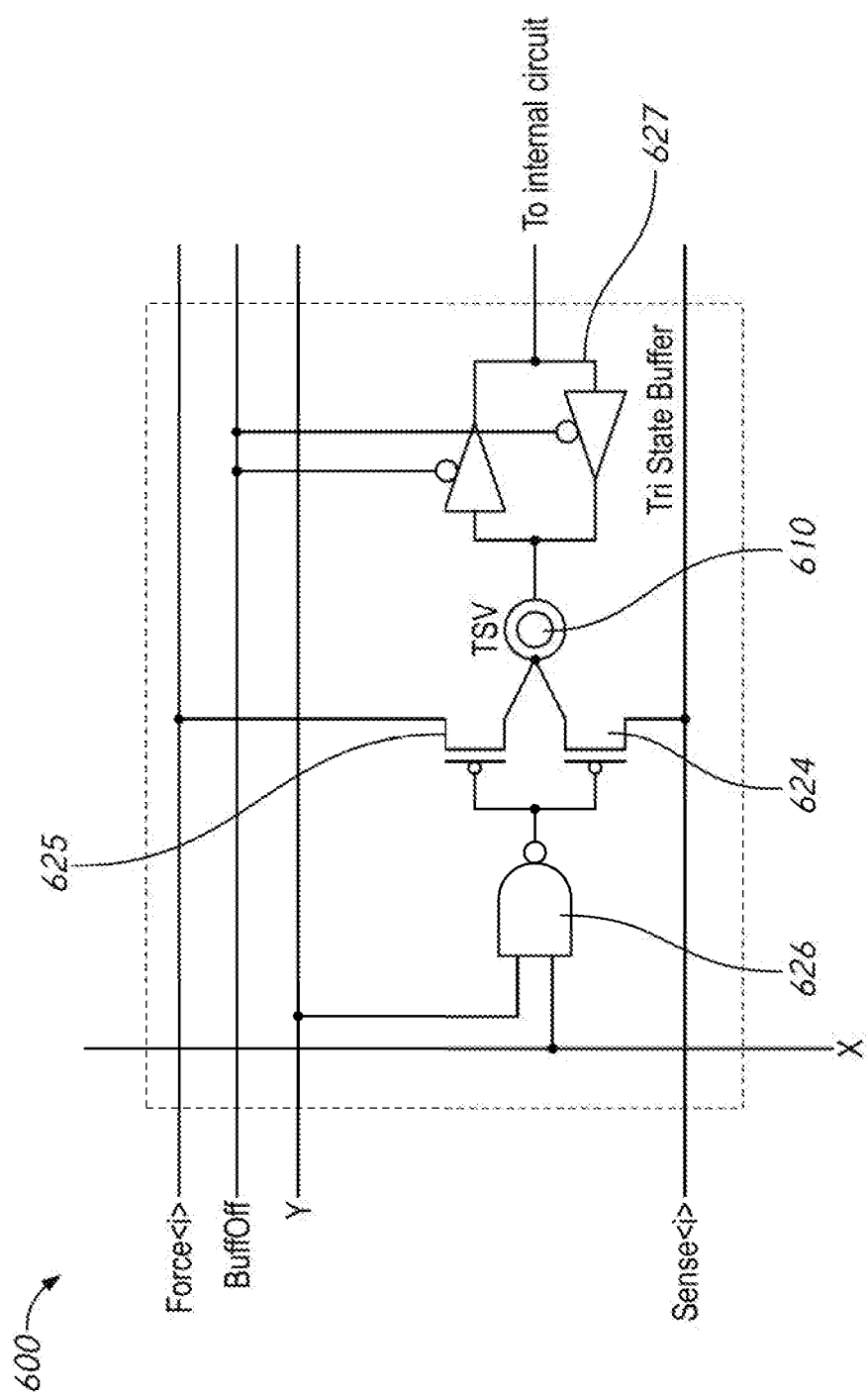
FIG. 6 is a schematic diagram of a TSV buffer circuit according to an embodiment of the present disclosure.

FIG. 6 shows a TSV buffer circuit 600 according to an embodiment of the present disclosure. The TSV buffer circuit 600 may be used, in some embodiments, to implement the TSV buffer circuits 522a-b of FIG. 5. The TSV buffer circuit may include a TSV 610, a transistor sense MOS 624, a transistor force MOS 625, a NAND gate 626, and a buffer circuit 627. Each of the transistors sense MOS 624 and force MOS 625 may be P-channel type transistors.

The source of the sense MOS 624 is coupled to the TSV 610, and the drain of the sense MOS 624 is coupled to Sense<i>. The drain of the force MOS 625 is coupled to Force<i> and the source of the force MOS 625 is coupled to the TSV 610. The gates of the sense MOS 624 and force MOS 625 are coupled to the output of the NAND gate 626. The inputs of the NAND gate 626 are control signals X and Y, which may be provided by shift registers (e.g., shift registers 523 of FIG. 5). The TSV 610 is also coupled to internal circuitry of the memory device via buffer circuit 627, which may be a tri state buffer. Buffer circuit 627 is coupled to a buffer control signal BufOff.

The buffer circuit 627 may be used to selectively couple the TSV 610 to the internal circuitry (e.g., memory cells) of the layer. The signal BufOff may be used to deactivate the buffer circuit 627 to prevent coupling between the TSV 834 and the internal circuits. The signal BufOff may cause the buffer circuit 627 to enter a high impedance state. The signal BufOff may be provided by logic within the memory layer (e.g., by shift register 523 of FIG. 5) or provided by external components (e.g., a memory controller) coupled to the memory device.

The NAND gate 626 may be used to selectively couple the TSV 610 to Force<i> and Sense<i> via the force MOS 625 and the sense MOS 624, respectively. The NAND gate 626 may receive control signals X and Y from the shift registers (e.g., shift registers 523 of FIG. 5) of that layer. The control signal X may be provided by the shift register XSR, and the command signal Y may be provided by the shift register YSR. The NAND gate 626 will output a low voltage (e.g., a low logic level, 0V) when both of the command signals X and Y are a high voltage (e.g., a high logic level, Vdd). The output of the NAND gate 626 is provided to the gates of the transistors 624, 625, which may become conductive when the voltage on their gates is a low voltage. Thus, the TSV 610 may only be coupled to Force<i> and Sense<i> when the command signals X and Y are both at a high level.

Figure 7:
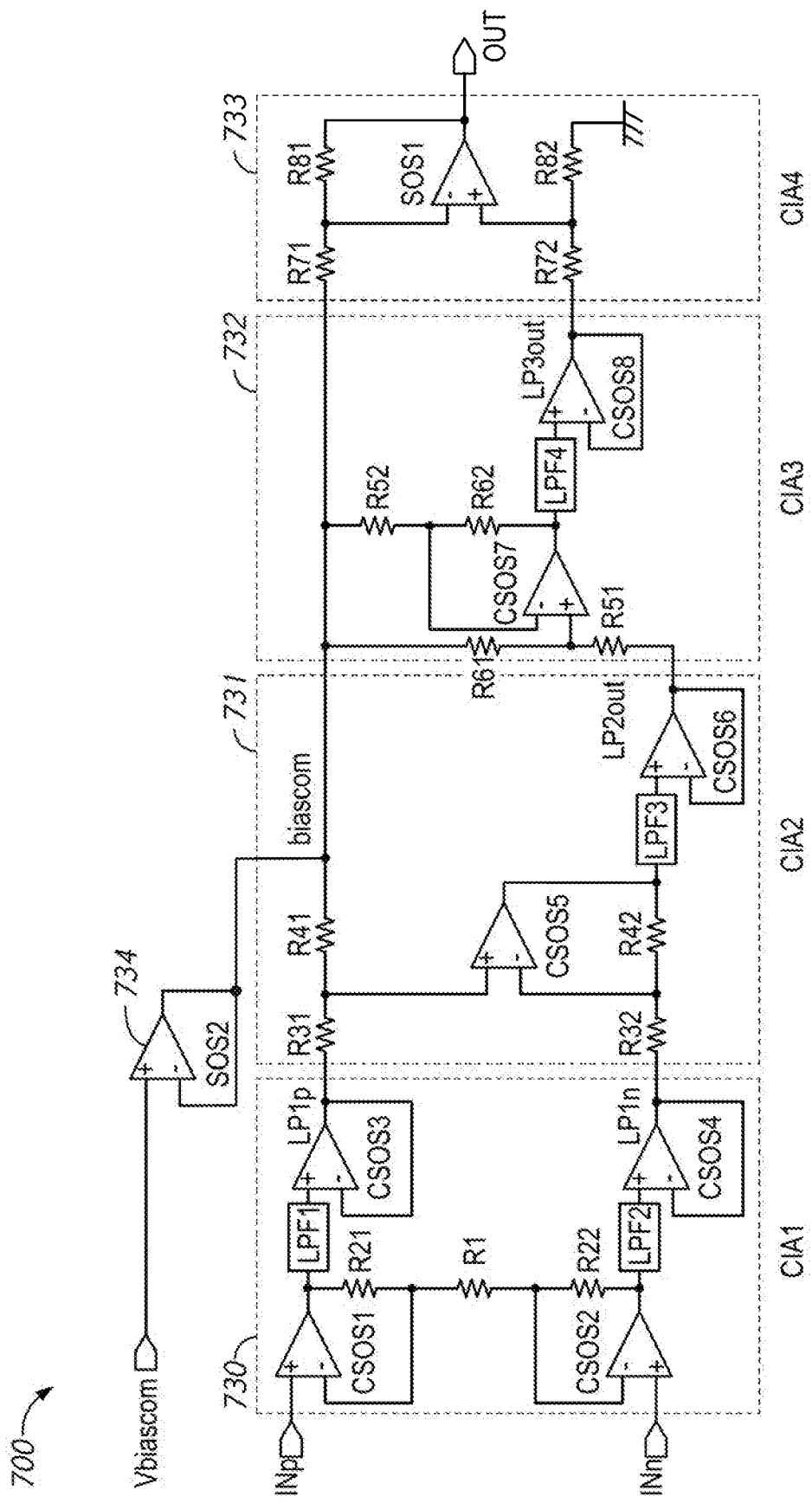
FIG. 7 is a schematic diagram of a chopper instrumentation amplifier according to an embodiment of the present disclosure.

FIG. 7 shows a chopper instrumentation amplifier according to an embodiment of the present disclosure. The CIA 700 may, in some embodiments, be an implementation of the chopper instrumentation amplifier 502 of FIG. 5. The chopper instrumentation amplifier (CIA) 700 may receive a differential input INp and INn and provide an output OUT. The input INp may be coupled to Sense+ and the input INn may be coupled to Sense−. The chopper instrumentation amplifier 700 may include a first amplifier 730, a second amplifier 731, a third amplifier 732, and a fourth amplifier 733. The chopper instrumentation amplifier 700 also may include a buffer circuit 734 which couples a bias voltage Vbiascom to the second, third, and fourth amplifiers 731-733. The first, second, and third amplifiers 730-732 may be chopper amplifiers, while the fourth amplifier 733 may be a non-chopper amplifier.

The first amplifier 730 receives input voltages INp and INn and provides a differential output LP1p and LP1n to a first intermediate node. The second amplifier 731 is coupled to the first intermediate node and provides an output LP2out to a second intermediate node. The third amplifier 732 is coupled to the second intermediate node and provides an output LP3out to a third intermediate node. The fourth amplifier 733 is coupled to the third intermediate node and provides the output voltage OUT.

Each of the amplifiers 730-733 may include one or more sub-amplifier. The fourth amplifier 733 and the buffer circuit 734 may include symmetric operation-point self-biased amplifiers (SOS amplifiers). The SOS amplifiers are differential amplifiers similar to op-amps, and will be described in more detail in FIG. 8. The first, second, and third amplifiers 730-732 may include chopper-switch SOS amplifiers (CSOS amplifiers) which may generally be similar to the SOS amplifiers, but include chopper circuits. The CSOS amplifiers are described in more detail in FIG. 9. The CSOS amplifiers may function similarly to the SOS amplifiers, however the chopper circuits may be used to cancel an input offset voltage input to the CSOS amplifier. The CIA 700 may also include low-pass filters (LPFs), which may remove the rectangular wave superimposed by the chopper circuits of the CSOS amplifiers.

The first amplifier 730 is coupled to the input voltages INp and INn. The input voltage INp is coupled to the non-inverting input of a CSOS amplifier CSOS1, while the input voltage INn is coupled to the non-inverting input of an amplifier CSOS2. The outputs of CSOS1 and CSOS2 may be coupled together by resistors R21, R1, and R22 which are coupled in series between the outputs. The inverting input of CSOS1 may be coupled between resistors R21 and R1, while the inverting input of CSOS2 may be coupled between R1 and R22. The output of CSOS1 is coupled in series to LPF1 and to the non-inverting input of CSOS3. The output of CSOS2 is coupled in series to LPF2 and to the non-inverting input of CSOS4. CSOS3 provides an output voltage LP1$p$, which is coupled to the inverting input of CSOS3 and provided as an output of the amplifier 730. CSOS4 provides an output voltage LP1$n$, which is coupled to the inverting input of CSOS4 and provided as an output voltage of the first amplifier 730.

The first amplifier 730 amplifies the differential input potential (e.g., the difference between INp and INn) with a gain A1d that can be calculated by equation 18, below:

$$A1d = 1 + 2\left(\frac{R2}{R1}\right) \qquad \text{Eqn. 18}$$

The resistors R21 and R22 are assumed to have equal resistances to each other, which is equal to R2. The first amplifier has a common mode amplification A1C (e.g., amplification of a voltage shared across INp and INn) of unity (e.g., A1C=1). Because the amplifiers CSOS1 and CSOS2 include chopper circuits, the input offset voltages on CSOS1 and CSOS2 are canceled. However, a rectangular wave with an amplitude equal to the input offset voltage multiplied by A1d (see equation 18) is superimposed on the output of CSOS1 and CSOS2. The low pass filters LPF1 and LPF2 may be used to reduce or remove the rectangular wave from the outputs of CSOS1 and CSOS2. The amplifiers CSOS3 and CSOS4 are used as voltage followers in order to boost the current along outputs LP1$p$ and LP1$n$. Accordingly, the rectangular wave which uses input offset voltage of CSOS3 and CSOS4 as part of its amplitude remains superimposed on the outputs LP1$n$ and LP1$p$, but the rectangular wave is not amplified by the first amplifier, and so may have a negligible impact on the second amplifier 731.

The second amplifier 731 receives the outputs LP1$p$ and LP1$n$ provided by the first amplifier 730 as inputs. The second amplifier 731 also receives bias voltage Vbiascom provided by buffer circuit 734. The buffer circuit 734 may act as a voltage follower, and may be an SOS amplifier, SOS2. A non-inverting input of SOS2 is coupled to the voltage Vbiascom, and the output Vbiascom is coupled to the inverting input of SOS2. The input LP1$p$ is coupled to Vbiascom through two resistors R31 and R41 coupled in series. A non-inverting input of an amplifier CSOS5 is coupled between R31 and R41. The input LP In is coupled to a low-pass filter LPF3 via two resistors R32 and R42 in series. The inverting input of CSOS5 is coupled between R32 and R42. The output of CSOS5 is coupled between R42 and LPF3. LPF3 provides a filtered output to a non-inverting input of amplifier CSOS6, which outputs a voltage LP2out which is coupled back to the inverting input of CSOS6. The second amplifier 731 provides the voltage Vbiascom as a first output voltage and LP2out as a second output voltage.

The second amplifier 731 amplifiers the differential between inputs LP1$p$ and LP1$n$ by a gain A2$d$ given by equation 19 below:

$$A2d = \frac{R4}{R3} \qquad \text{Eqn. 19}$$

The resistors R41 and R42 have an equal value of R4, and the resistors R31 and R32 have an equal value of R3. If there is no differential voltage between the inputs (e.g., LP1$p$−LP1$n$=0) then the output of the chopper amplifier CSOS5 is the bias voltage Vbiascom. In that scenario, the input offset voltage of the CSOS5 is amplified by a gain of A2$os$, which is given by equation 20, below:

$$A2os = 1 + \frac{R4}{R3} \qquad \text{Eqn. 20}$$

The amplified input offset voltage is superimposed on the output of CSOS5 as a rectangular wave. The low-pass filter LPF3 may remove the amplified input offset voltage. The amplifier CSOS6 may be used as a voltage follower to drive current on the output. The rectangular wave applied by the chopper circuit of CSOS6 is superimposed on the output voltage LP2out. However, since this wave was not amplified, its effect on the third amplifier 732 may be negligible.

The third amplifier 732 receives the outputs of the second amplifier 731, Vbiascom and LP2out as inputs. The third amplifier 732 may couple the Vbiascom to LP2out with two resistors R61 and R51 coupled in series. A chopper amplifier CSOS7 may have a non-inverting input which is coupled between R61 and R51. The amplifier CSOS7 may provide an output which is coupled to a low-pass filter LPF4 and also coupled to Vbiascom via two resistors R62 and R52 which are coupled in series. An inverting input of CSOS7 is coupled between resistors R52 and R62. The filtered output of the low-pass filter LPF4 is coupled to a non-inverting input of a chopper amplifier CSOS8, which provides an output voltage LP3out. The inverting input of CSOS8 is coupled to the output LP3out. The third amplifier 732 provides the bias voltage Vbiascom and LP3out as outputs.

The third amplifier 732 may be generally similar to the second amplifier 731, except that the third amplifier 732 has a chopper amplifier CSOS7 in which both the inverting and non-inverting inputs are coupled to the bias voltage Vbiascom (via resistors R52 and R61 respectively). The input of the chopper amplifier CSOS7 is the differential between Vbiascom and LP2out, and the output is expressed by the differential gain A3$d$ given by equation 21 below:

$$A3d = \frac{R6}{R5} \qquad \text{Eqn. 21}$$

In the third amplifier 732, the resistors R61 and R62 may have values equal to R6, while the resistors R51 and R52 may have values equal to R5. The common mode voltage that is output by the third amplifier may be Vbiascom. The chopper amplifier CSOS7 provides an output with a superimposed rectangular wave with an amplitude determined by the input offset voltage of CSOS7 and amplified by a gain of A3os given by equation 22 below:

$$A3os = \left(1 + \frac{R6}{R5}\right) \qquad \text{Eqn. 22}$$

In order to remove this amplified rectangular wave, the output of chopper amplifier CSOS7 is provided to a low-pass filter LP4, which strips the rectangular wave from the amplified signal. The low-pass filter LP4 then provides the stripped amplified signal to a second chopper amplifier CSOS8, which acts as a voltage follower. The chopper amplifier CSOS8 also applies a rectangular wave on the output signal, however it is not amplified, and so may have a negligible impact on the fourth amplifier 733.

The fourth amplifier 733 receives the outputs of the third amplifier, Vbiascom and LP3out, as inputs. The fourth amplifier 504 may couple the input voltage LP3out to ground through resistors R72 and R82 coupled in series. A non-inverting input of an amplifier SOS1 is coupled between the resistors R72 and R82. The amplifier SOS1 provides an output OUT, is coupled to the input Vbiascom via two resistors R81 and R71 which are coupled in series. An inverting input of the amplifier is coupled between the resistors R71 and R81. The output voltage OUT is provided as the output of the fourth amplifier 733.

The fourth amplifier 733 may have a differential gain of Ad4 which is applied to the potential difference between LP3out and Vbiascom, and given by equation 23 below:

$$Ad4 = \left(\frac{R8}{R7}\right) \qquad \text{Eqn. 23}$$

In the fourth amplifier 733, the resistors R71 and R72 may have a value equal to R7, and the resistors R81 and R82 may have a value of R8. The fourth amplifier may provide a common mode voltage of 0V. The amplifier SOS1 may not include a chopper circuit and may increase the input offset by a gain of A4os, given by equation 24 below:

$$A4os = \left(1 + \frac{R8}{R7}\right) \qquad \text{Eqn. 24}$$

The amplified offset voltage provided by the amplifier SOS1 may remain as an error of the output voltage OUT. The superimposed (unamplified) rectangular wave that was superimposed on LP3out by voltage follower CSOS8 of the third amplifier 732 may remain on the output voltage OUT. However, the superimposed rectangular wave may be small in magnitude compared to the signal on the output voltage OUT, and may be a 'ripple' on the signal.

Accordingly, overall the amplifier 700 receives a differential input INp and INn and amplifies it by an overall differential gain A to provide the output voltage OUT. The overall differential gain A may be found by multiplying the differential gains of each of the amplifiers 730-733, and is given by equations 25 and 26, below:

$$A = A1d * A2d * A3d * A4d \qquad \text{Eqn. 25}$$

$$A = \left(1 + 2\left(\frac{R2}{R1}\right)\right)\left(\frac{R4}{R3}\right)\left(\frac{R6}{R5}\right)\left(\frac{R8}{R7}\right) \qquad \text{Eqn. 26}$$

From equation 26, it may be seen that the overall amplification of the differential signal is determined by the resistor values R1-R8 which are chosen. These values may be selected based on the desired application and the desired operating characteristics of the amplifier. In some embodiments, the gain of each of the stages (amplifiers 730-733) may be kept low. By keeping the gain of each stage low, the amplitude of the rectangular wave resulting from the input offset voltage is also kept relatively low. This may prevent the waveforms of the amplifier 700 from reaching the rail voltages (e.g., Vdd and Vss) and distorting the waveform. The low pass filters (e.g., LPF1-LPF4) and the voltage followers (e.g., CSOS3, CSOS4, CSOS6, and CSOS8) may reduce the output ripple imposed by the first three stages 730-732 to an amount equivalent to the input offset of each voltage follower. This may reduce a risk of the waveform being deformed by subsequent stages of the chopper instrumentation amplifier 700.

The allowable common mode voltage (e.g., the range of common mode voltages that do not lead to any distortion of the waveform due to clipping on the rail voltages) of the chopper instrumentation amplifier 700 may span almost the full range of the rail voltages (e.g., from approximately Vdd to approximately ground). Low gain at the first stage 730 may be dispersed by low gain of the subsequent stages 731-733.

In one example, the total gain A may be about 125. Higher or lower total gains are possible in other examples. In the example where the total gain A is 125, the resistor values R1-R8 may be set such that A1d=5, A2d=5, A3d=5, and A4d=1. Other gains and other distributions of gains between the amplifiers 730-733 may be used in other examples. The gain of the final stage may be set to unity (e.g., A4d=1) which allows error voltages to be close to 0V, since the output waveform and its deformation are not increased by the fourth amplifier 733. In this example, the input common mode voltage may be between Vdd*(1/50) and Vdd*(1−1/50). Thus in this configuration the range of allowable common mode voltages is between 98% of Vdd and 2% of Vdd. In other examples, the gain of the final stage (e.g., fourth amplifier 733) may be greater than unity.

As an example application of the chopper instrumentation amplifier 700, the chopper instrumentation amplifier 700 may be used to amplify a voltage Vx from TSV testing. The chopper instrumentation amplifier 700 may be configured as previously described such that the gains of amplifiers 730-732 are 5, and the gain of amplifier 733 is 1. If a maximum input offset of the CIA 700 is assumed to be 10 mV, then the input offset which appears at the output is 20 mV (10 mV*A4os=10 mV*2). The 20 mV offset is the result of input offset of amplifier SOS1 of the fourth amplifier 733. The offset error equivalent can be found to be 160 μV (20 mV/125) when the offset is converted to the input. Only a rectangular wave with the amplitude of 10 mV at maximum is superimposed, so that the output ripple containing the error resulting from that superimposition is an offset of 240 μV (30 mV/125) converted to the input. In the TSV testing scenario, a current of 200 µA may be driven through the TSV. If the TSV has a resistance of 10Ω, then the voltage Vx is 2 mV. The error caused by the 240 µV of offset is thus 1.2Ω. Thus, the CIA 700 may be sensitive enough to measure small (e.g., ~10Ω) resistances in a TSV.

Although a specific implementation of the chopper instrumentation amplifier 700 was described in FIG. 7, it is to be understood that the configuration of the amplifier 700 may be changed in other implementations. For example, the third amplifier 732 may be omitted from the chopper instrumentation amplifier 700. In that example the second amplifier 731 may provide voltages Vbiascom and LP2out to the resistors R71 and R72 (respectively) of the fourth amplifier 733.

Figure 8:
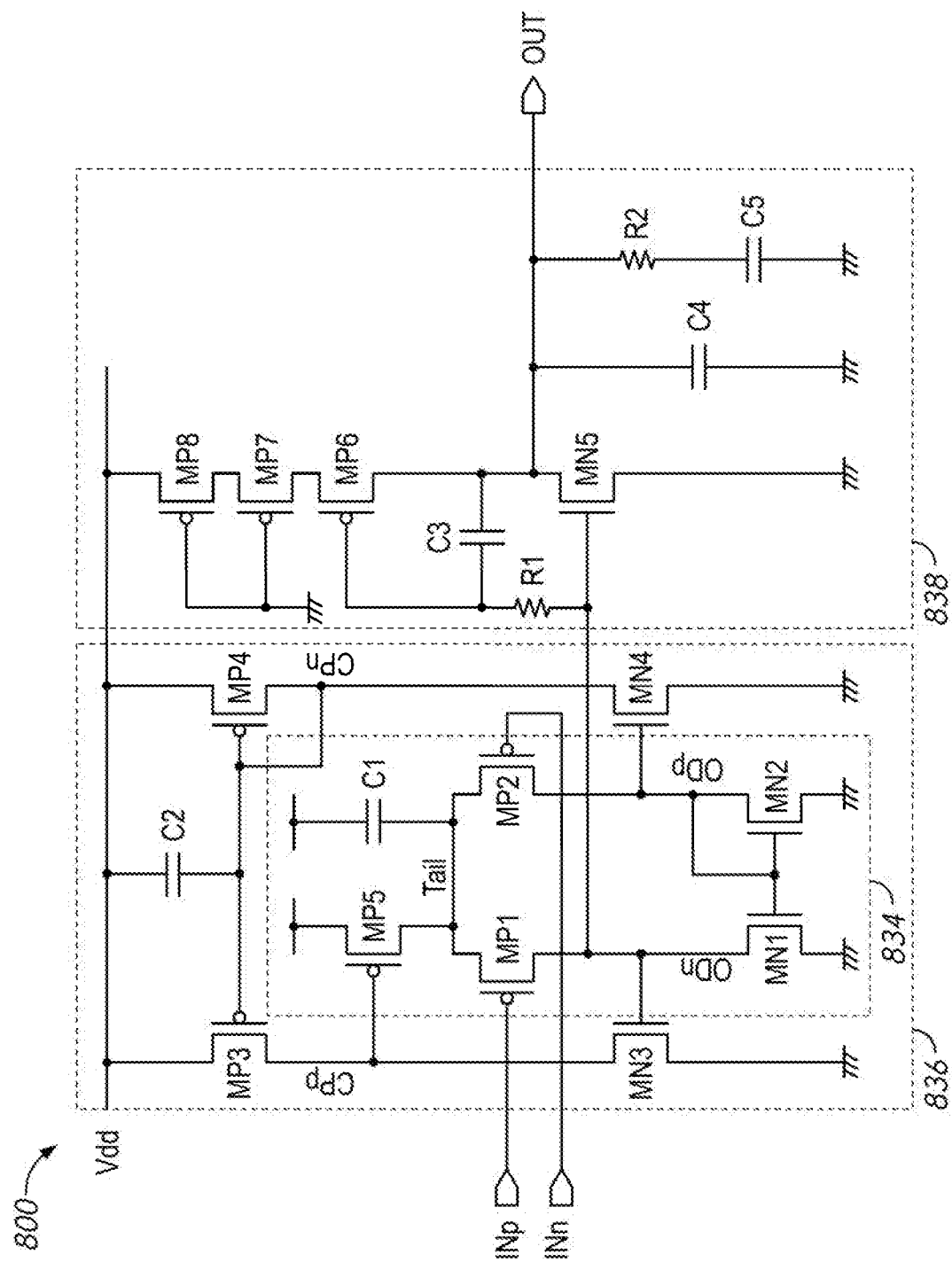
FIG. 8 is a schematic diagram of a non-chopper amplifier according to an embodiment of the present disclosure.

FIG. 8 shows a non-chopper amplifier (an SOS amplifier) according to an embodiment of the present disclosure. The SOS amplifier 800 may, in some embodiments, be used as the amplifiers SOS1-SOS2 of FIG. 7. The SOS amplifier 800 may function as a differential amplifier and amplify a potential difference across two inputs INp and INn. The SOS amplifier 800 may provide an output voltage OUT which is based on the inputs INp and INn. The SOS amplifier 800 includes a main amplifier 834, a sub amplifier 836, and an output stage 838. The main amplifier 834 is coupled to the input voltages INp and INn and provides an output to the output stage 838, which provides the output voltage OUT. The main amplifier 834 may be coupled to the sub amplifier 836, which may provide feedback to regulate the voltages on the main amplifier 834. While FIG. 6 may show a specific implementation of the SOS amplifier 600, it is to be understood that variations may be made to the layout and components of the SOS amplifier 600 without departing from the present disclosure.

The main amplifier 834 includes transistors MN1, MN2, MP1, MP2, and MP5 as well as a capacitor C1. The gate of transistor MP1 is coupled to INp while the gate of transistor MP2 is coupled to INn. The sources of the transistors MP1 and MP2 may be coupled together by a tail voltage Tail. Tail is coupled to a source voltage Vdd through capacitor C1 and to the drain of transistor MP5. The drain of transistor MP1 is coupled to a voltage ODn, and the drain of transistor MP2 is coupled to a voltage ODp. The gates of transistors MN2 and MN1 are coupled together, and are coupled to the voltage ODp. The drain of transistor MN2 is coupled to the voltage ODp and the voltage ODn is coupled to the drain of the transistor MN1. The sources of both transistors MN1 and MN2 are both coupled to ground. The voltages ODn and ODp are provided as outputs of the main amplifier 834 and as inputs of the sub amplifier 836. The voltage ODn is additionally provided as an input to the output stage 838.

The sub amplifier 836 may maintain a relationship of the voltages ODp and ODn within the main amplifier 834. The sub amplifier includes transistors MN3, MN4, MP3, and MP4 as well as a capacitor C2. The gates of transistors MN3 and MN4 are coupled to input voltages ODp and ODn. The sources of transistors MN3 and MN4 are both coupled to ground, while their drains are coupled to voltages CPp and CPn respectively. The voltages CPp and CPn are coupled to the drains of transistors MP3 and MP4 respectively. The sources of the transistors MP3 and MP4 are coupled to a source voltage Vdd. The gates of the transistors MP3 and MP4 are coupled together, are coupled to the source voltage Vdd through capacitor C2, and are coupled to the voltage CPn. The voltage CPp is also coupled to the gate of transistor MP5 of the main amplifier 834.

The sub amplifier 836 may control the gate bias of transistor MP5 in order to keep the voltage of ODp and ODn equal to each other. Keeping the voltages ODp and ODn equal also leads to the voltages CPp and CPn being equal. Thus, the transistor pairs MN1 and MN2 and MP1 and MP2 operate at the same operating point. In this manner the system offset voltage is minimized. In some examples, the system offset may be ±50 µV or less, even over a wide range of input voltages in a state where device dispersion does not exist.

The output stage 838 is provided the voltage ODn as an input, and amplifies it to an output voltage OUT. The output stage 838 may include transistors MN5, MP6, MP7, and MP8, resistors R1 and R2, and capacitors C3, C4, and C5. The input voltage ODn is coupled to the gate of transistor MN5, which has a source coupled to ground, and a drain coupled to the output voltage OUT. The input voltage ODn is also coupled to the output voltage OUT via a resistor R1 and capacitor C3 coupled in series. The output voltage OUT is also coupled to ground via a capacitor C4 and coupled to ground via a resistor R2 and capacitor C5 coupled in series. A series of transistors MP8 to MP6 is coupled such that a drain of MP8 is coupled to the source of MP7 and a drain of MP7 is coupled to a source of MP6. The drain of MP6 is coupled to the output voltage OUT. The source of MP8 is coupled to the source voltage Vdd. The gates of MP8 and MP7 are coupled to ground. The gate of MP6 is coupled between the resistor R1 and the capacitor C3.

Figure 9:
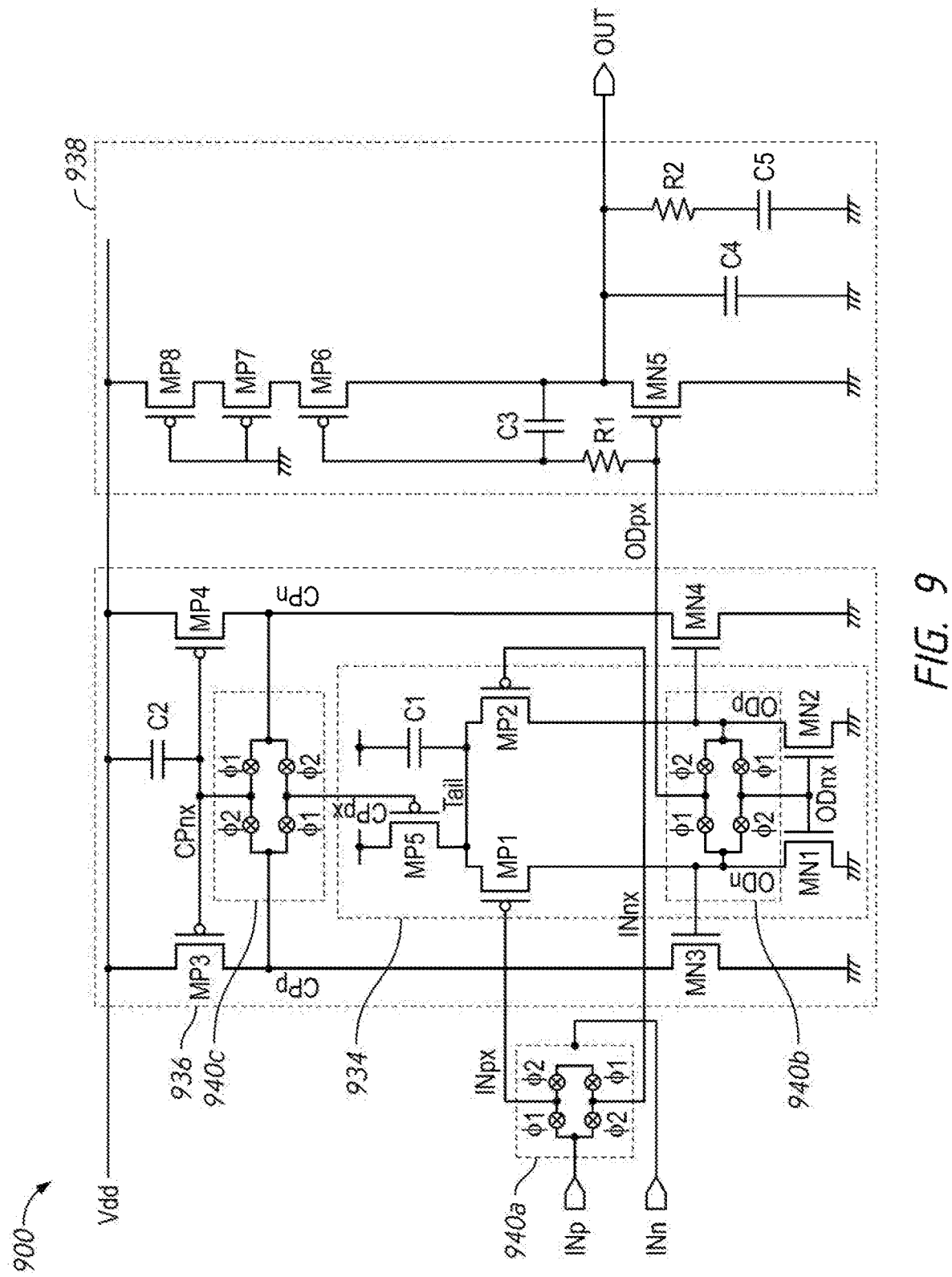
FIG. 9 is a schematic diagram of a chopper amplifier according to an embodiment of the present disclosure.

FIG. 9 shows a chopper amplifier (a CSOS amplifier) according to embodiments of the present disclosure. The chopper amplifier 900 may be used, in some embodiments, to implement the chopper amplifiers CSOS1-CSOS8 of the chopper instrumentation amplifier 500 of FIG. 5. The CSOS amplifier 900 includes a main amplifier 934, a sub amplifier 936, and an output stage 938. In addition, the CSOS amplifier 700 also includes chopper circuits 940*a-c*. The chopper amplifier 900 may be generally similar to the SOS amplifier 800 of FIG. 8 except for the addition of chopper circuits 940*a-c* between the input and the main amplifier 934 and in the main amplifier 934 and sub amplifier 936. For the sake of brevity, features and components that were previously described in regards to FIG. 8 will not be described again.

The CSOS amplifier 900 includes a first chopper circuit 940*a* which is positioned between the input voltages INp and INn and the main amplifier 934. The first chopper circuit 940*a* receives the inputs INp and INn and provides outputs INpx and INnx to the respective gates of transistors MP1 and MP2 of the main amplifier 934. The second chopper circuit 940*b* is inserted in the main amplifier 934 and is coupled to voltages ODn and ODp as inputs. The second chopper circuit provides a voltage ODnx which is coupled to the gates of transistors MN1 and MN2, and also provides a voltage ODpx which is provided to the output stage 938 as an output of the main amplifier 934. The third chopper circuit 940*c* is coupled to the sub amplifier 936 and receives the voltages CPp and CPn as inputs. The third chopper circuit 940*c* provides an output voltage CPnx which is coupled to the gates of transistors MP3 and MP4 and also coupled to a source voltage Vdd via capacitor C2. The third chopper circuit 940*c* also provides a voltage CPpx which is coupled to the gate of transistor MP5 of the main amplifier 934.

The chopper circuits 940*a-c* may receive a first and second input, and provide a first and second output. The chopper circuits 940*a-c* may vary in time such that they alternate providing the first input voltage as the first input and the second input voltage as the second output with providing the first input voltage as the second output and the second input voltage as the first output. The coupling of the inputs to the outputs may vary in time at a rate based on clock signals φ1 and φ2. The clock signals φ1 and φ2 may be provided from outside the CSOS amplifier 900. Because the CSOS amplifier 900 is a differential amplifier, the use of the chopper circuits to alternate inputs may reduce or cancel the input voltage offset by making it appear on both input terminals of the CSOS amplifier 900.

The first chopper circuit 940a may act as a modulation switch, while the second and third chopper circuits 940b, 940c may act as demodulation switches. The chopper circuits 940a-c may each receive clock signals φ1 and φ2. The clock signals may have a frequency which may be used by the chopper circuit to up-converge the input offset and the input signal to the odd-order frequency of the clock signal. The demodulation switches may then remove these frequency components by down-converting the voltages that have been amplified by the CSOS amplifier 900. The demodulation chopper circuits 940b and 940c are coupled to ODn and ODp and to CPp and CPn respectively. As with the amplifier 800 of FIG. 8, the voltages ODn and ODp are kept equal to each other, and the voltages CPp and CPn are kept equal to each other. In this manner, if an input offset is zero, the voltages do not change before and after the chopper circuit is activated by the clock signals. By keeping the voltages equal at the chopper circuits 940b and 940c, a transient output error from switching of the chopper circuit is reduced.

The characteristics of the test circuitry of the IF die (e.g., the force amplifier 504 and CIA 502 of FIG. 5) may depend, at least in part, on the resistance of the coupling between the test circuitry components and the TSV to be tested (e.g., similar to Rfl_core and Rfl_if of FIG. 2). The resistance may be at least partially dependent on the structure of the conductive elements (e.g., wiring) which couples the test components to the signal TSVs.

Embodiments of the present disclosure may employ a wiring structure with a reduced resistance compared to the prior art discussed in FIGS. 1, 2 and 4. FIGS. 10-14 show example wiring structures of the present disclosure. The wiring structure may couple the amplifiers (e.g., the force amplifier 504 and/or CIA 502 of FIG. 5) to the TSV buffer circuits. The reduced resistance of the wiring structure may allow the amplifiers to be placed further away from the TSVs while maintaining the operating characteristics of the test circuit. In some embodiments, the wiring structure may be a mesh wiring structure, where multiple TSV buffer circuits (e.g., TSV buffer circuits 522a-b of FIG. 5) are coupled together by a grid of conductive elements which is also coupled to one or more of the amplifiers of the IF die. FIGS. 10-14 show example mesh wiring structures, one or more of which may be used to the couple the amplifiers of FIG. 5 (and/or FIGS. 15-17) to the TSV buffer circuits.

Figure 10:
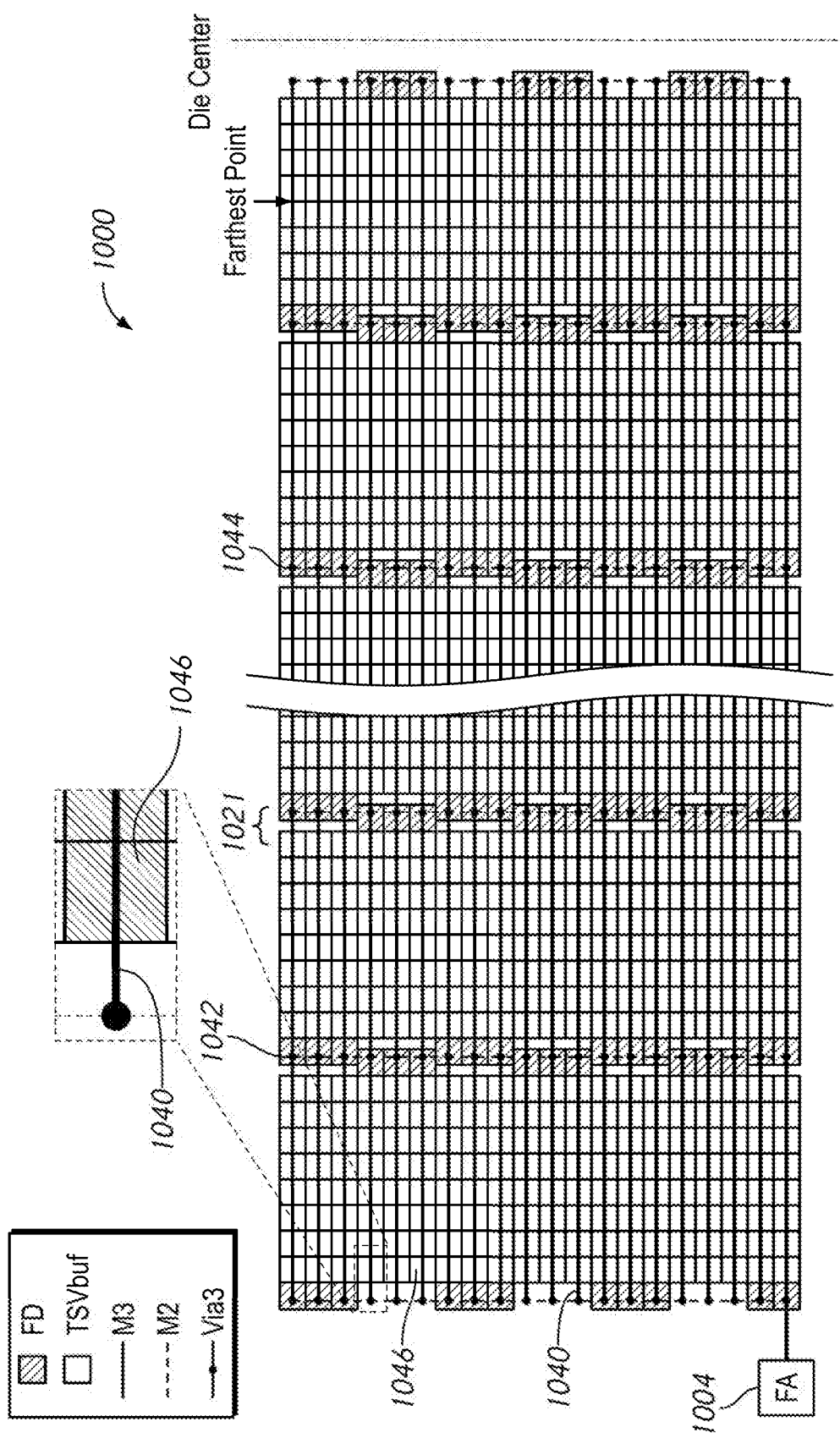
FIG. 10 is a schematic diagram of a mesh wiring structure according to an embodiment of the present disclosure.

FIG. 10 shows an example mesh wiring structure 1000 according to an embodiment of the present disclosure. The mesh wiring structure 1000 may be a part of a memory device (e.g., memory device 500 of FIG. 5) and may be used to couple a current from the force amplifier 1004 to signal TSV regions 1046. The mesh wiring structure 1000 may be part of the IF die (e.g., IF die 508 of FIG. 5). FIG. 10 may be a representation of a 'top down' view of the memory device (e.g. looking towards a layer of the memory device, as opposed to a cross-section of the layers of the memory device). The mesh wiring structure 1000 includes a first wiring layer (horizontal solid lines of the mesh) 1040, and a second wiring layer (vertical dotted lines of the mesh) 1042. The mesh wiring structure is shown overlaid on a layer of signal TSV regions 1046, which are depicted as open boxes, and current supply circuits 1021, which are shown as shaded boxes.

The mesh wiring structure 1000 includes conductive lines in a first wiring layer 1040 and conductive lines in a second wiring layer 1042. The conductive lines in the first and second wiring layers 1040, 1042 may be coupled together by via holes 1044. The conductive lines may be arranged in a grid pattern, with the conductive lines in the first layer 1040 being roughly parallel to each other, the conductive lines in the second layer 1042 being roughly parallel to each other, and the lines in the first wiring layer 1040 being roughly perpendicular to the lines in the second wiring layer 1042. The via holes 1044 may be placed at the intersection of the lines in the first and second wiring layers 1040, 1042 to couple the first wiring layer 1040 to the second wiring layer 1042. The lines in the first wiring layer 1040 may correspond to the Force<i> wiring of FIG. 6. The first wiring layer 1040 may be formed from a first metal layer of the die. For example, in some embodiments, the first wiring layer is an M3 metal layer of the memory device. The lines of the second wiring layer 1042 may align with the current supply circuits (FD) 1021 as part of a power source TSV area of the memory die. The second wiring layer 1042 may be formed from a second metal layer of the die. For example, in some embodiments, the second wiring layer 1042 may be an M2 metal layer of the memory device. In some embodiments, the via holes 1044 may be the Via3 between M3 and M2 metal layers of the memory device.

The force amplifier 1004 may be located outside (e.g., not underneath) the area of the TSV block. The force amplifier 1004 may provide a current (e.g. Force_if) to the mesh wiring structure 1000. The current Force_if may be coupled along a line of the first wiring layer 1040 and may be coupled along via holes 1044 to the line of the second wiring layer 1042 and through additional via holes 1044 to the other lines of first wiring layer 1040. The lines of the first wiring layer 1040 may be coupled (not shown in FIG. 10) to the signal TSV regions 1046. As described herein, the signal TSV regions 1046 include both the signal TSVs (e.g., signal TSV 510 of FIG. 5 or TSV 610 of FIG. 6) and the TSV buffer circuits (e.g., TSV buffer circuits 522 of FIG. 5 or TSV buffer circuit 600 of FIG. 6).

The mesh wiring structure 1000 may have a relatively low resistance between the force amplifier 1004 and any given point of the mesh wiring structure 1000. The reduced resistance may allow the force amplifier 1004 (and the CIA, not shown) to be placed further from the signal TSV that are measuring the resistance of. The force amplifier 1004 (and the CIA) may be located in a vacant region of the memory device chip, and may not be located underneath the TSV blocks of the memory device. The force amplifier 1004 may be located in a region of the chip away from a center of the chip. The placement of the force amplifier 1004 outside the TSV block footprint may make it possible to neglect the chip size overhead to the TSV resistance measurement circuit.

An example may be considered using a memory device with a layout and components as described in FIGS. 5-10. The chopper instrumentation amplifier may obtain an equivalent input offset of 240 µVm and allow an input common mode voltage of 2% of Vdd to 98% of Vdd. The force amplifier may provide a constant current on the IF die of the memory device while a current is supplied by current supply circuits on a core die of the memory device. This may reduce the resistance between the current source and the signal TSVs (Rfl_core) since the current supply circuits may be adjacent to the signal TSVs. The memory device may also have a low resistance between the signal TSV and the force amplifier (Rfl_if) due to the mesh wiring structure. The Rfl_if between the farthest point marked in FIG. 10 and the force amplifier may be about 2780.

Considering the characteristics of this example for testing the resistance of a TSV, in one example the current Iref may be about 800 µA, while the gain of the chopper instrumentation amplifier is about 125. From this, an output scale of 10/V can be determined, which if the test circuitry is sensitive to 0.5V, allows for rejection of TSVs with 50Ω or more of resistance. The input conversion offset of 240 µV yields an offset of 30 mV at the output, which translates to an error of 0.3Ω. The input common mode voltage lies at about 0.7V, with a voltage drop of Vdd-0.24V-FD device, where FD device is the voltage drop of the current supply circuit. In some embodiments, it may be possible to further increase the current (Iref), and thus measure a smaller resistance, if the current supply capacity (MOS size) of the current supply circuit is sufficient.

FIGS. 11-14 show mesh wiring structures (1100-1400, respectively) in accordance with embodiments of the present disclosure. In the embodiments of FIGS. 11-14, the force amplifier 1104-1404 may provide current along both the core and IF side of the TSVs. The mesh wiring structures 1100, 1200 of FIGS. 11-12 may be used to couple the force amplifier 1104, 1204 to the upper portion of a signal TSV in the IF die, while the mesh wiring structures 1300, 1400 of FIGS. 13-14 may be used to couple force TSVs in each layer of the memory dies to the lower portion of signal TSVs in each layer of the memory dies. Thus, the memory device utilizing the mesh wiring structures 1100-1400 may generally be similar to the memory device 100 of FIG. 1, except that the mesh wiring structure 1100/1200 may replace the Force– line in the IF die 108 and/or the mesh wiring structures 1300/1400 may replace one or more of the Force<i> lines in the layers 106a-d.

Figure 11:
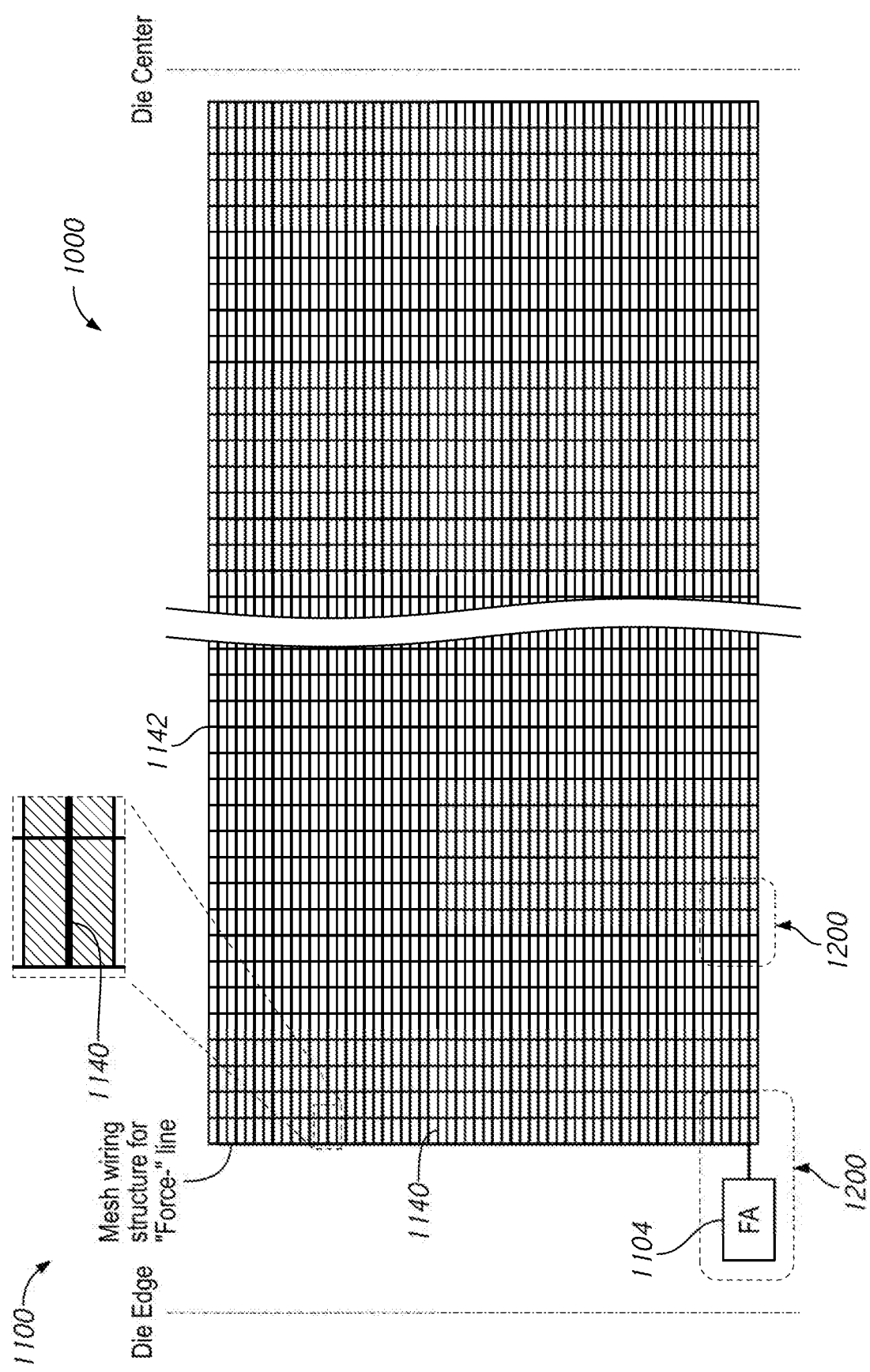
FIG. 11 is a schematic diagram of a mesh wiring structure according to an embodiment of the present disclosure.

FIG. 11 shows a schematic diagram of a mesh wiring structure 1100 according to an embodiment of the present disclosure. The wire mesh structure 1100 may generally be similar in layout to the wire mesh structure 1000 of FIG. 10. The wire mesh structure 1100 includes conductive lines in a first wiring layer 1140 and conductive lines in a second wiring layer 1142 arranged in a grid. The intersections of the conductive lines in the first and second wiring layers 1140, 1142 may be coupled by via holes (not shown). In contrast to the mesh wiring structure 1000 of FIG. 10, in the mesh wiring structure 1100, the first wiring layer 1140 may be the M2 metal layer while the second wiring layer 1142 may be the M3 metal layer. The mesh wiring structure 1100 may be part of the IF die and may lie underneath the TSV block.

Figure 12:
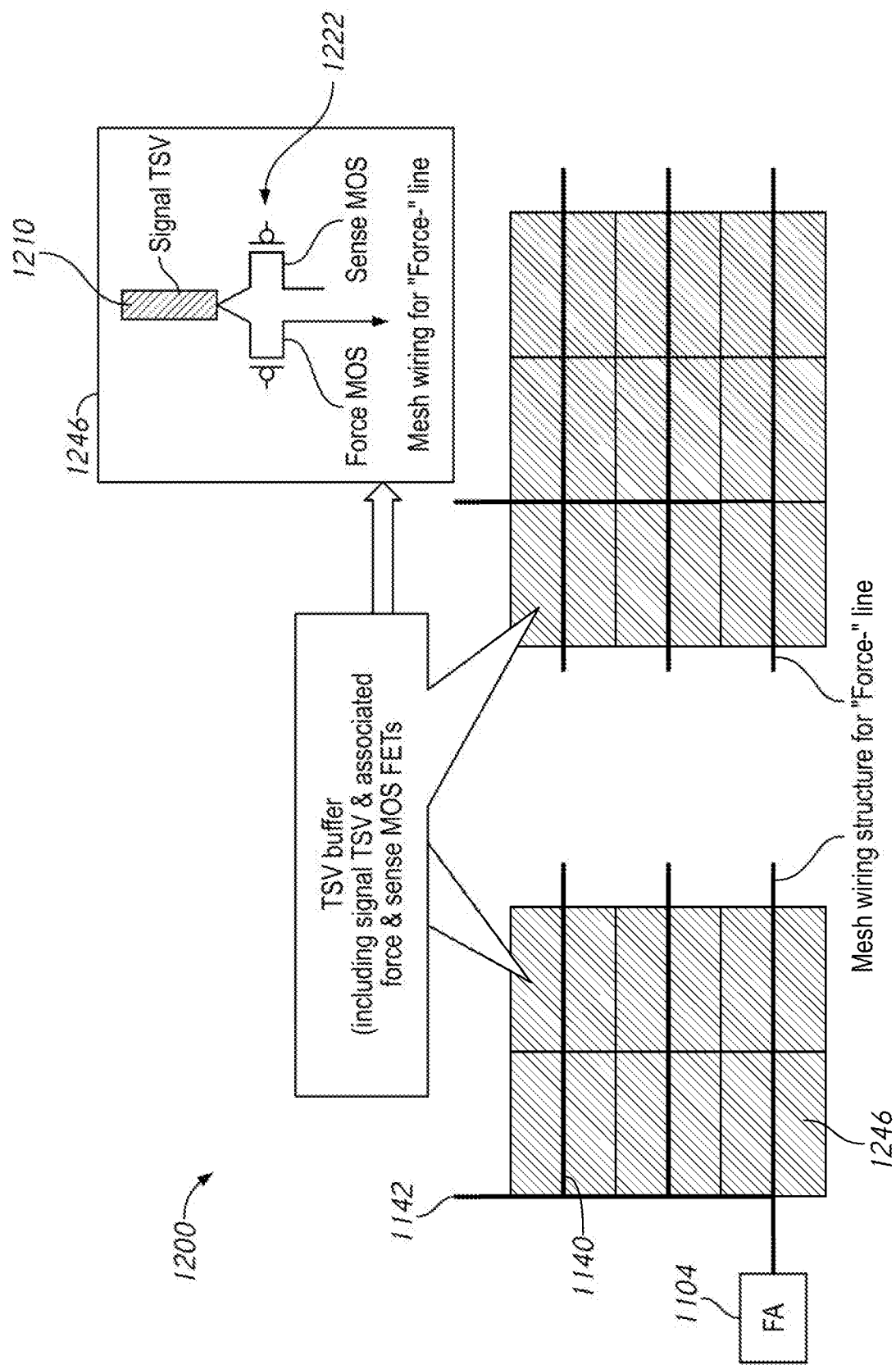
FIG. 12 is a schematic diagram of a portion of the mesh wiring structure of FIG. 11 according to an embodiment of the present disclosure.

FIG. 12 is a schematic diagram of a portion 1200 of the mesh wiring structure 1100 of FIG. 11 according to an embodiment of the present disclosure. The view of FIG. 12 may be enlarged compared to the view of FIG. 11. The portion 1200 includes conductive lines in the first and second wiring layer, 1140, 1140 coupled to the force amplifier 1104. The conductive lines may be overlaid on TSV regions 1246. The TSV regions 1246 (also shown as an inset) may include the lower portion of the signal TSV 1210 and the TSV buffer circuit 1222. The TSV buffer circuit 1222 includes transistors Sense MOS and Force MOS, which have sources coupled to the signal TSV 1210. Sense MOS has a drain which is coupled to a signal line (not shown). Force MOS has a drain which couples to the conductive lines in the first wiring layer 1140. In this manner the force amplifier 1104 may be selectively coupled to the signal TSVs 1210 along the mesh wiring structure 1100.

Figure 13:
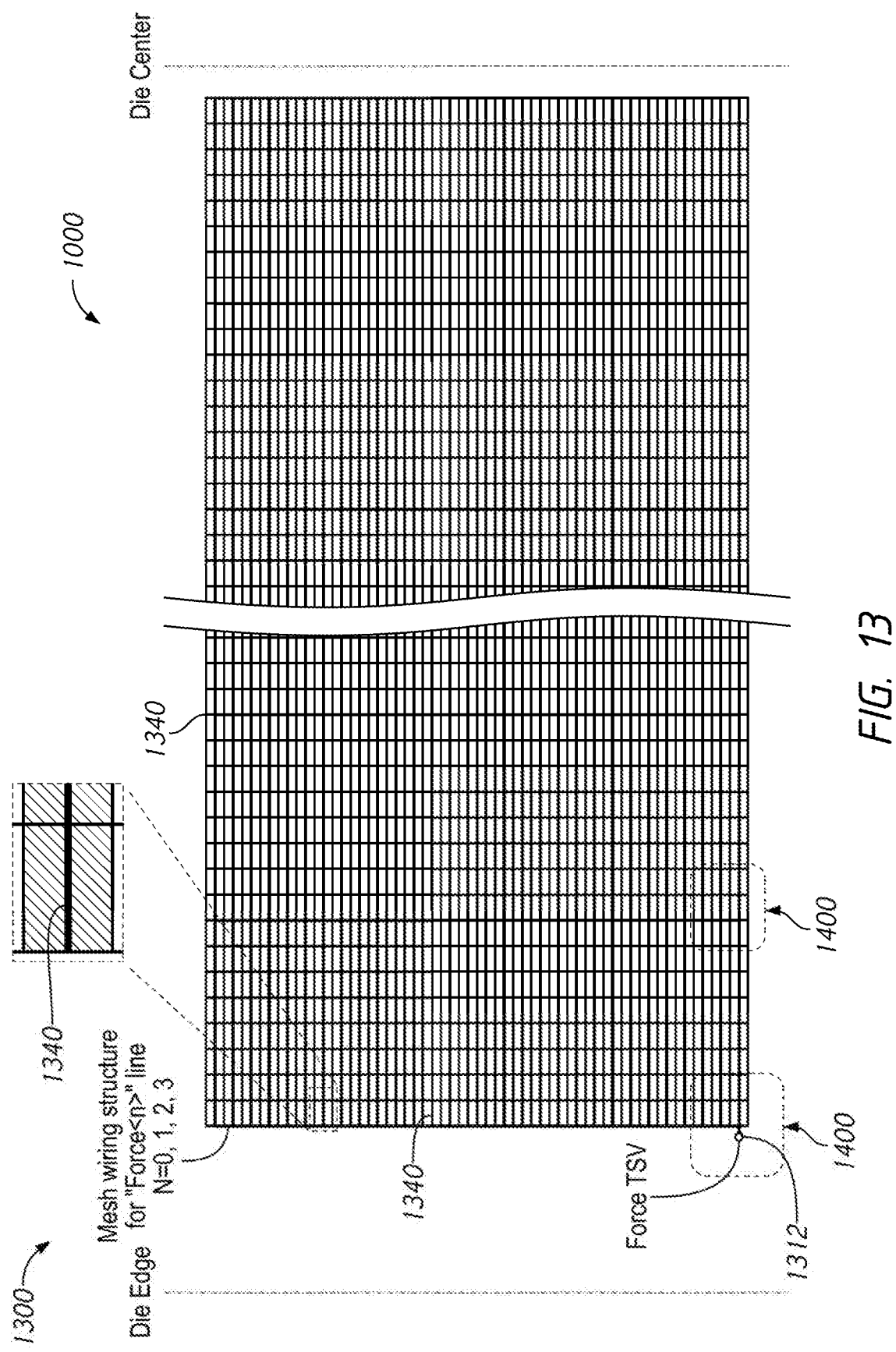
FIG. 13 is a schematic diagram of a mesh wiring structure according to an embodiment of the present disclosure.

FIG. 13 shows a schematic diagram of a mesh wiring structure 1300 according to an embodiment of the present disclosure. The mesh wiring structure 1300 may generally be similar to the mesh wiring structure 1100 of FIG. 11, except that the mesh wiring structure 1300 is included in the layers of the memory die rather than in the IF die. Accordingly, the conductive lines in the first wiring layer 1340 may be coupled to a force TSV 1312 (which in turn is coupled to the force amplifier).

Figure 14:
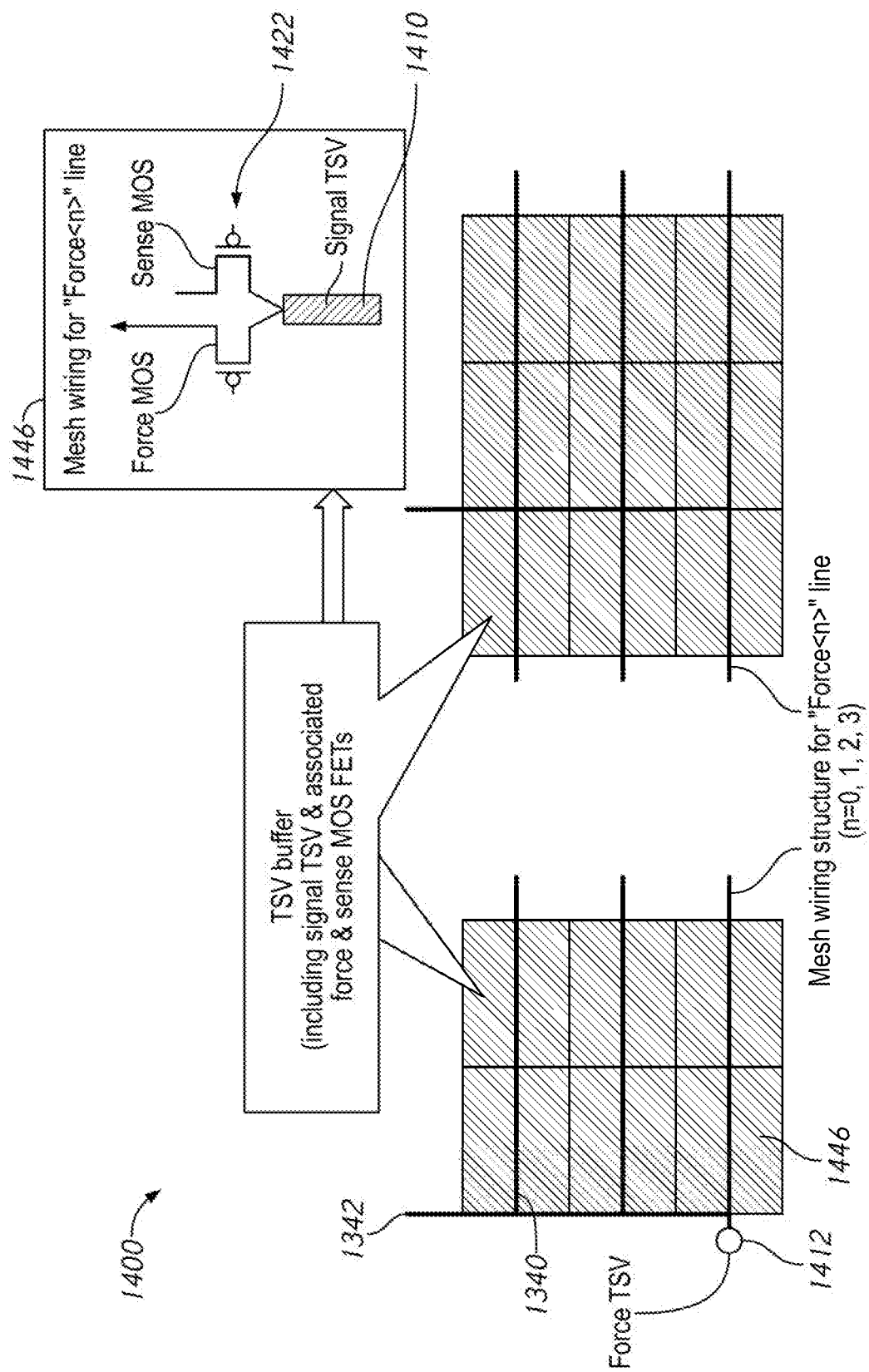
FIG. 14 is a schematic diagram of a portion of the mesh wiring structure of FIG. 13 according to an embodiment of the present disclosure.

FIG. 14 is a schematic diagram of a portion 1400 of the mesh wiring structure 1300 of FIG. 13 according to an embodiment of the present disclosure. The portion 1400 may generally be similar to the portion 1200 of FIG. 12. The TSV portion 1446 may include an lower portion of a signal TSV 1410 coupled to the TSV buffer circuit 1422. The TSV buffer circuit may include transistors Force MOS and Sense MOS which have drains coupled to the signal TSV 1410. The source of Sense MOS may be coupled to a sense line of the layer of the memory die (not shown), while the source of the Force MOS may be coupled to the conductive lines of the first wiring layer 1340. In this manner the force TSV 1412 may be selectively coupled to the signal TSV 1410 through the mesh wiring structure 1300.

Figure 15:
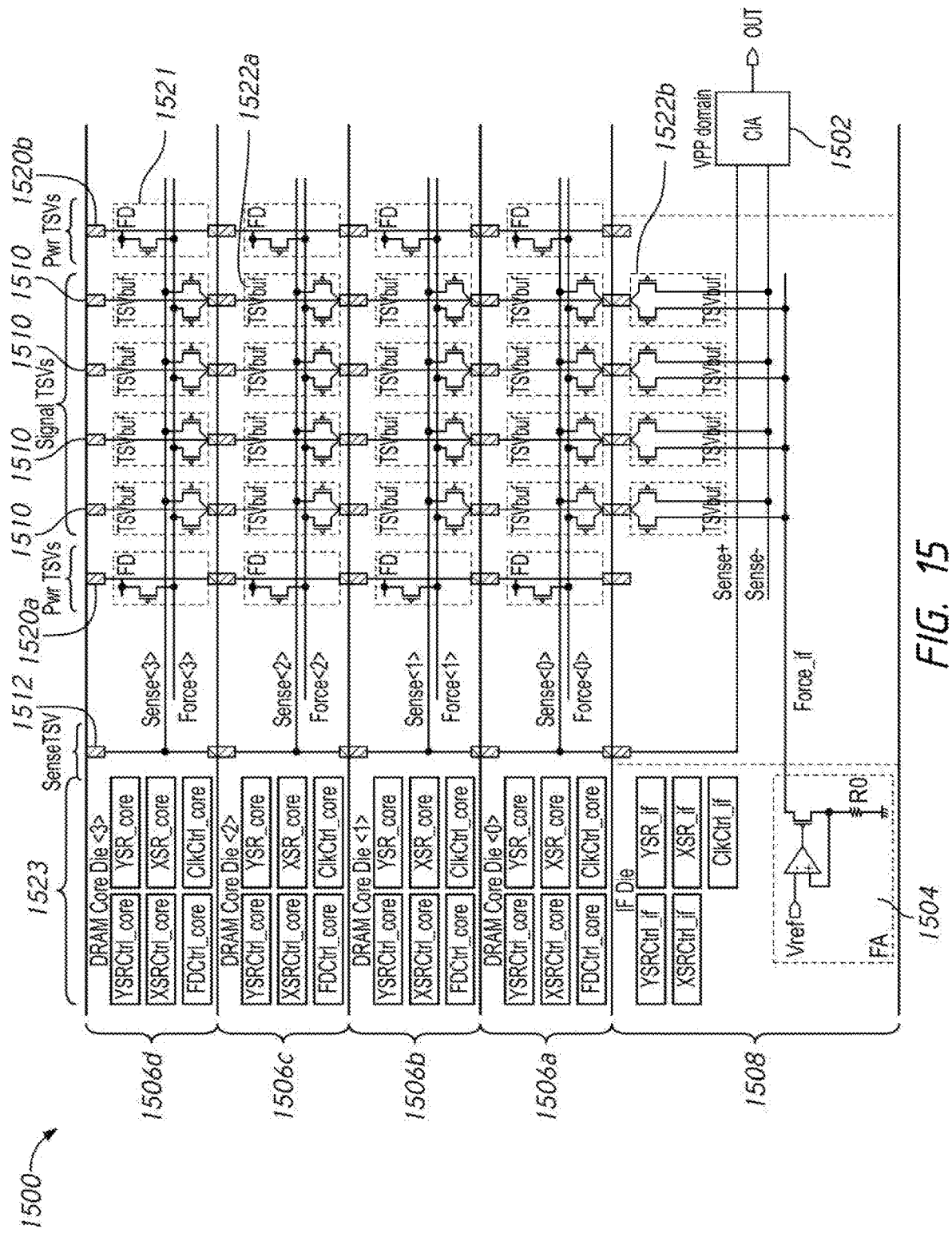
FIG. 15 is a schematic diagram of an IF die according to an embodiment of the present disclosure.

FIG. 15 shows a memory device 1500 in accordance with an embodiment of the present disclosure. The memory device 1500 may be generally similar to the memory device 500 of FIG. 5. The memory device 1500 includes a plurality of layers 1506a-d stacked on top of an IF die 1508. The layers 1506a-d and the IF die 1508 are coupled via TSVs including signal TSVs 1510, sense TSVs 1512 and power TSVs 1520a-b. The signal TSVs 1510 are coupled to TSV buffer circuits 1522a-b, and the power TSVs 1520a-b are coupled to current supply circuits 1521. Each layer 1506a-d and the IF die 1508 includes shift register circuits 1523 to control the TSV buffer circuits 1522a-b and the current supply circuits 1521. The IF die 1508 includes a force amplifier 1504 and a chopper instrumentation amplifier 1502. In the interest of brevity, features and components similar to those described with respect to the memory device 500 will not be repeated here.

The memory device 1500 includes a chopper instrumentation amplifier 1502 which is coupled to separate power supply voltages than the rest of the components of the memory device 1500. In some embodiments, the CIA 1502 may be coupled to a power supply voltage Vpp which is different than the power supply voltage Vdd that the force amplifier 1504 and the current supply circuits 1521 are coupled to. The power supply voltage Vpp may be higher than Vdd. The chopper instrumentation amplifier 1502 may share a common ground voltage (e.g., 0V) with the other components of the memory device 1500.

The increased power supply voltage (Vpp> Vdd) of the CIA 1502 may eliminate the restriction of the upper limit of the input common mode voltage Vcom_max (see equation 16, above). The transistor size of the current supply circuit 1521 may be increased (relative to the current supply circuit 521 of FIG. 5) to increase a power supply capacity. This may cause a common mode voltage to be Vdd when the resistance of a signal TSV 1510 near the power supply circuit 1521 is measured. Since the common mode voltage is Vdd, but the upper limit of the common mode voltage is dependent on Vpp> Vdd, the upper limit will not be exceeded in this example.

Figure 16:
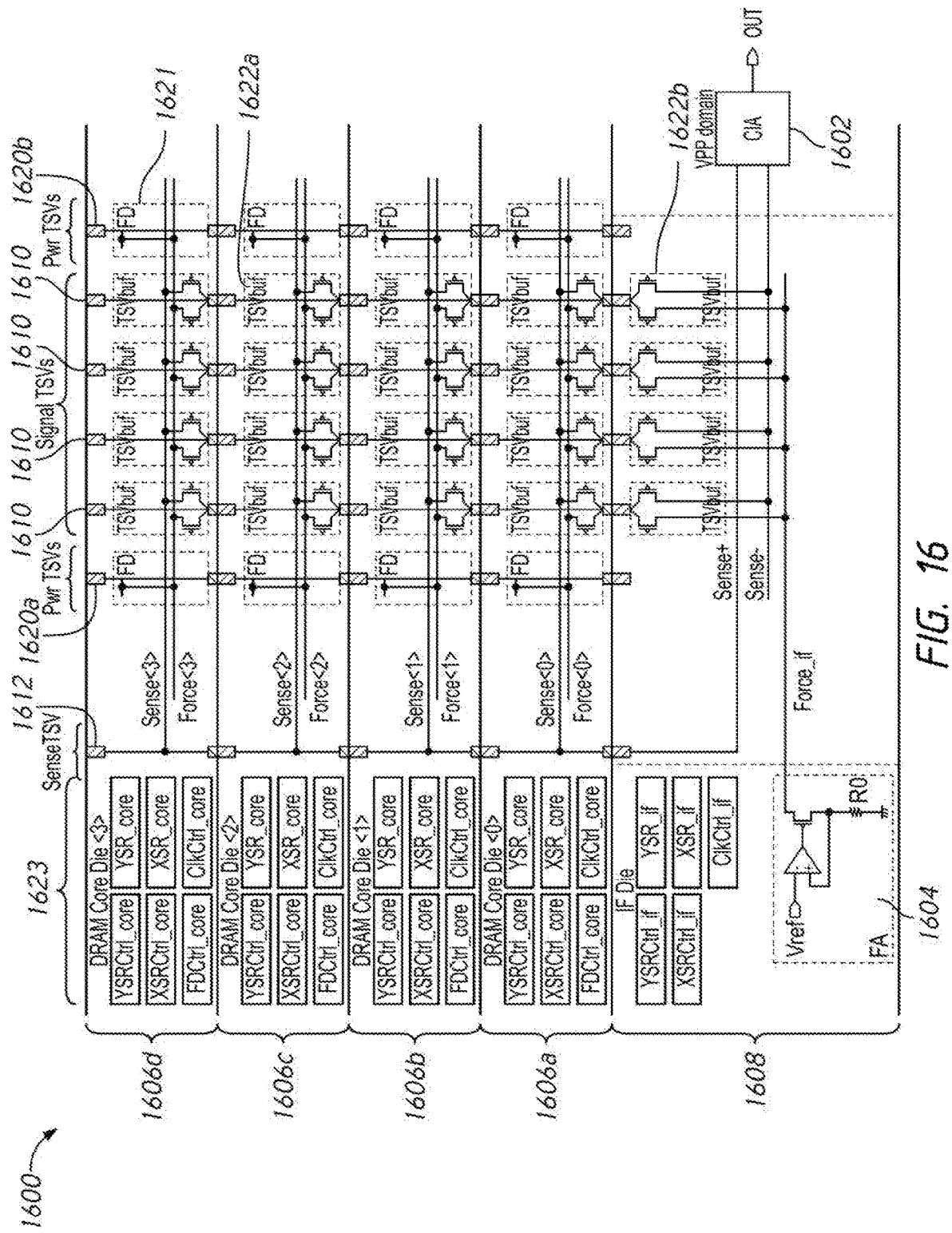
FIG. 16 is a schematic diagram of an IF die according to an embodiment of the present disclosure.

FIG. 16 shows a memory device 1600 in accordance with an embodiment of the present disclosure. The memory device 1600 may generally be similar to the memory device 1500 of FIG. 15. For the sake of brevity, components and features similar to those described previously are not described again.

Similar to the memory device 1500 of FIG. 15, the memory device 1600 includes a CIA 1602 which is coupled to a separate power supply voltage Vpp. The power supply voltage Vpp may be higher than the power supply voltage Vdd provided to the other components of the memory device 1600. As described with respect to FIG. 15, increasing the power supply voltage of the CIA 1602 to Vpp may allow for increased power in the current supply circuits 1621 up to Vdd.

In the memory device 1600, the current supply circuits 1621 may directly couple the voltage Vdd to the force lines Force<i> in each of the layers 1606a-d. Since there is no transistor as part of the current supply circuit 1621, there is no need to increase the size of the transistor to accommodate the increased power, and layout of the components in each layer 1606a-d may be easier.

Figure 17:
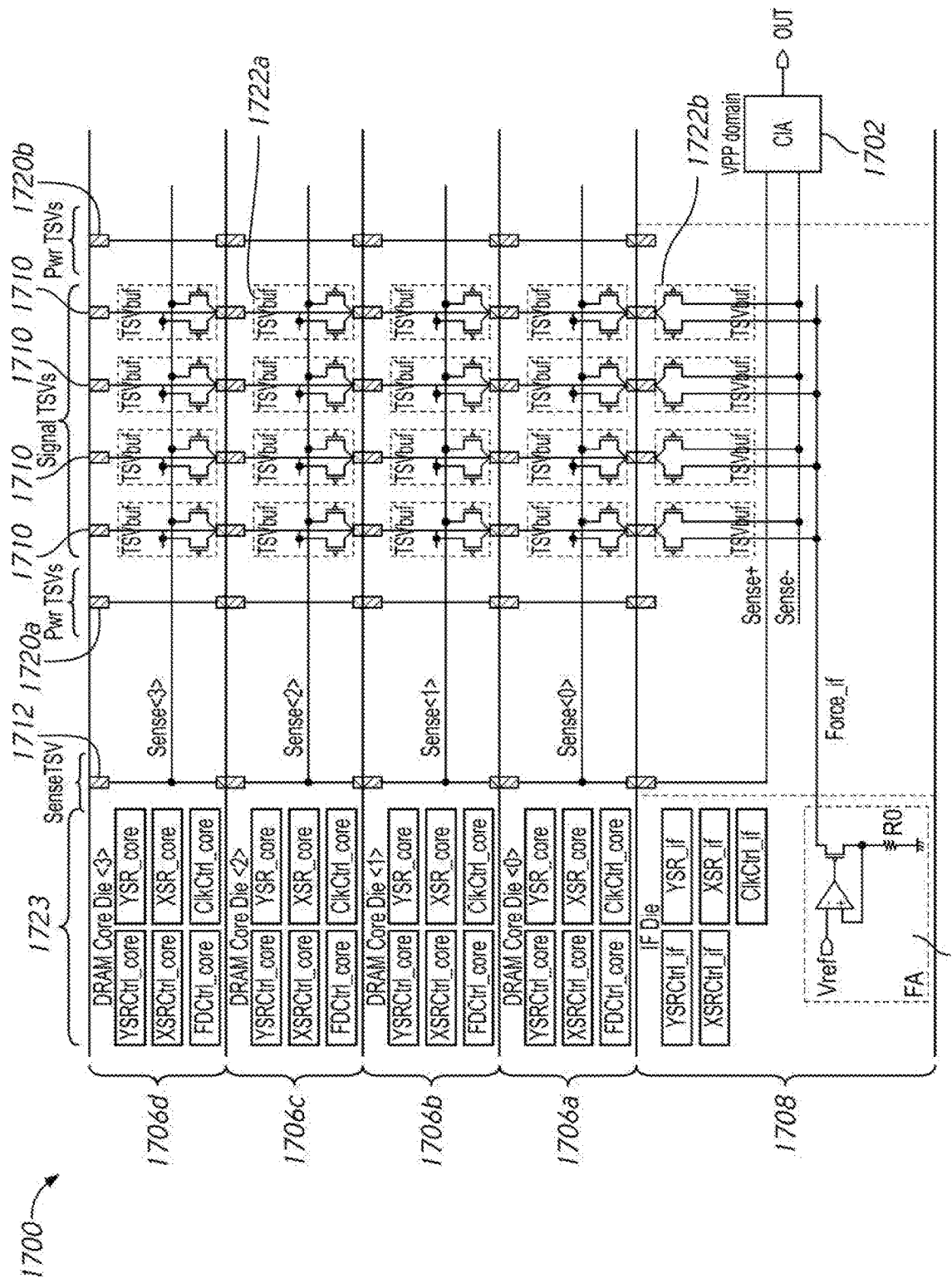
FIG. 17 is a schematic diagram of an IF die according to an embodiment of the present disclosure.

FIG. 17 shows a memory device 1700 in accordance with an embodiment of the present disclosure. The memory device 1700 may generally be similar to the memory device 1600 of FIG. 16. For the sake of brevity, components and features similar to those described previously are not described again.

As with the memory device 1600, the CIA 1602 is coupled to a power supply voltage Vpp. Unlike the memory device 1600, in the memory device 1700, the power supply circuits have been eliminated, and thus the lines Force<i> have also been eliminated from the memory device 1700.

In the memory device 1700, the TSV buffer circuits 1722a of the layers 1706a-d are coupled directly to the power supply voltage Vdd. In particular, a force MOS of the TSV buffer circuit 1722a has a source which is coupled to Vdd and a drain which is coupled to the lower portion of a signal TSV 1710. The elimination of the Force<i> wiring may be useful in cases where the wiring tracks in the area around the TSVs are short.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
an interface (IF) die; and
at least one memory die, wherein the at least one memory die is stacked over the IF die through at least one through silicon/substrate via (TSV) so that current flows through the at least one TSV between the IF die and the at least one memory die;
wherein the IF die comprises:
a first conductive line through which current flows, and
an amplifier coupled to the at least one TSV and configured to output a signal related to a voltage across the at least one TSV;
wherein the at least one memory die comprises a second conductive line through which the current flows; and
wherein the first conductive line comprises a mesh wiring structure.

2. The apparatus of claim 1, wherein the second conductive line comprises a mesh wiring structure.

3. The apparatus of claim 1,
wherein the at least one memory die is stacked over the IF die further through an additional TSV;
wherein the second conductive line is coupled between the at least one TSV and the additional TSV; and
wherein the IF die further comprises a current source coupled between the first conductive line and the additional TSV.

4. The apparatus of claim 1,
wherein the at least one memory die further comprises a first power line coupled to the second conductive line; and
wherein the IF die further comprises a current source and a second power line, the current source coupled between the first conductive line and the second conductive line.

5. The apparatus of claim 1, wherein the amplifier comprises a chopper instrumentation amplifier.

6. The apparatus of claim 1, wherein the mesh wiring structure comprises a first wiring layer and a second wiring layer.

7. An apparatus comprising:
a memory die comprising a through silicon/substrate via (TSV) block comprising a plurality of TSVs, the memory die comprising a current supply circuit coupled to a first side of the TSV; and
an IF die coupled to the memory die, the IF die comprising:
a force amplifier coupled to a second side of the TSV; and
a chopper instrumentation amplifier comprising a first input coupled to the first side of the TSV and a second input coupled to the second side of the TSV.

8. The apparatus of claim 7, wherein the IF die is positioned underneath the memory die, and wherein the force amplifier and the chopper instrumentation amplifier are positioned on an area of the IF die outside an area underneath the TSV block.

9. The apparatus of claim 7, wherein the force amplifier is coupled to the second side of the TSV along a mesh wiring structure.

10. The apparatus of claim 9, wherein the mesh wiring structure is positioned in an area of the IF die underneath the TSV block.

11. The apparatus of claim 9, wherein the mesh wiring structure comprises conductive lines in a first wiring layer and conductive lines in a second wiring layer, wherein the conductive lines in the second wiring layer are positioned underneath an area of the TSV block including the current supply circuit.

12. The apparatus of claim 7, wherein the chopper instrumentation amplifier is coupled to a first power supply voltage and the current supply circuit is coupled to a second power supply voltage.

13. The apparatus of claim 12, wherein the first power supply voltage is greater than the second power supply voltage.

14. The apparatus of claim 7, wherein the memory die comprises a first TSV buffer circuit coupled to the first side of the TSV.

15. The apparatus of claim 14, wherein the memory die comprises a shift register coupled to the first TSV buffer circuit to control selective coupling of the TSV to the current supply circuit and the chopper instrumentation amplifier.

16. The apparatus of claim 14, wherein the IF die comprises a second TSV buffer circuit coupled to the second side of the TSV.

17. The apparatus of claim 14, wherein the chopper instrumentation amplifier is coupled to a first power supply voltage, and the first TSV buffer circuit selectively couples a second power supply voltage to the TSV, wherein the first power supply voltage is greater than the second power supply voltage.

18. The apparatus of claim 7, wherein the current supply circuit comprises a transistor to selectively couple the first side of the TSV to a power supply voltage.

19. An apparatus comprising:
an amplifier comprising a chopper instrumentation amplifier;
a plurality of through silicon vias (TSVs); and
a mesh wiring structure comprising a grid of conductive elements, wherein the amplifier is coupled to the TSVs via the mesh wiring structure.

20. The apparatus of claim 19, wherein the grid of conductive elements comprises a plurality of conductive lines in a first metal layer, and a plurality of conductive lines in a second metal layer.

21. The apparatus of claim 19, further comprising a second mesh wiring structure coupled to the TSVs, wherein the mesh wiring structure is coupled to a first side of the TSVs and the second mesh wiring structure is coupled to a second side of the TSVs.

* * * * *